United States Patent
Mac et al.

(10) Patent No.: US 12,164,404 B2
(45) Date of Patent: Dec. 10, 2024

(54) APPROACHES OF INCIDENT MONITORING AND RESOLUTION

(71) Applicant: Palantir Technologies Inc., Denver, CO (US)

(72) Inventors: Brandon Mac, San Jose, CA (US); Joseph Sayegh, Paris (FR); Thomas Eckerle, Washington, DC (US); Zachary Romanow, Philadelphia, PA (US)

(73) Assignee: Palantir Technologies Inc., Denver, CO (US)

( * ) Notice: Subject to any disclaimer, the term of this patent is extended or adjusted under 35 U.S.C. 154(b) by 41 days.

(21) Appl. No.: 17/827,122

(22) Filed: May 27, 2022

(65) Prior Publication Data
US 2023/0315601 A1   Oct. 5, 2023

Related U.S. Application Data

(60) Provisional application No. 63/327,282, filed on Apr. 4, 2022.

(51) Int. Cl.
*H03M 7/30* (2006.01)
*G06F 11/30* (2006.01)
*G06F 16/36* (2019.01)

(52) U.S. Cl.
CPC ...... *G06F 11/3068* (2013.01); *G06F 11/3075* (2013.01); *G06F 16/367* (2019.01); *H03M 7/30* (2013.01)

(58) Field of Classification Search
None
See application file for complete search history.

(56) References Cited

U.S. PATENT DOCUMENTS

| | | | |
|---|---|---|---|
| 9,390,099 B1* | 7/2016 | Wang | H03M 7/707 |
| 9,558,251 B2* | 1/2017 | Simmen | G06F 16/258 |
| 10,116,329 B1* | 10/2018 | Bigman | G06F 3/0608 |
| 10,212,570 B1* | 2/2019 | Ramalingam | H04W 4/025 |
| 11,361,654 B2* | 6/2022 | Vijayakumari Mahasenan | H04L 12/1868 |
| 2005/0197991 A1* | 9/2005 | Wray | G06N 5/025 706/50 |
| 2006/0059173 A1* | 3/2006 | Hirsch | G06F 16/2455 |
| 2008/0024350 A1* | 1/2008 | Srinivasan | H03M 7/30 341/158 |
| 2008/0130165 A1* | 6/2008 | Partee | G11B 31/02 360/97.21 |

(Continued)

FOREIGN PATENT DOCUMENTS

WO   2020/106720 A1   5/2020

OTHER PUBLICATIONS

Extended European Search Report dated Jul. 19, 2023, issued in related European Patent Application No. 23153986.7 (9 pages).

*Primary Examiner* — Polina G Peach
(74) *Attorney, Agent, or Firm* — Sheppard Mullin Richter & Hampton LLP

(57) ABSTRACT

Computing systems methods, and non-transitory storage media are provided for obtaining information regarding an incident, generating a representation of the information, augmenting the representation with additional contextual information, determining a response to address the incident, and implementing the response or transmitting the determined response to a separate computing system that implements the response.

20 Claims, 17 Drawing Sheets

(56) References Cited

U.S. PATENT DOCUMENTS

| | | | | |
|---|---|---|---|---|
| 2012/0057802 | A1* | 3/2012 | Yuki | H04N 19/59 |
| | | | | 382/243 |
| 2013/0254711 | A1* | 9/2013 | Sievert | G06F 11/321 |
| | | | | 715/810 |
| 2013/0290241 | A1* | 10/2013 | Taylor | G06N 5/02 |
| | | | | 706/55 |
| 2014/0006643 | A1* | 1/2014 | Ur | H04L 67/01 |
| | | | | 709/247 |
| 2015/0186378 | A1* | 7/2015 | Berlingerio | H04L 43/04 |
| | | | | 707/748 |
| 2016/0275594 | A1* | 9/2016 | Mullakkara Azhuvath | |
| | | | | G06F 16/248 |
| 2018/0176578 | A1* | 6/2018 | Rippel | G06V 30/19173 |
| 2018/0190132 | A1* | 7/2018 | Cronkhite | G08G 5/0013 |
| 2018/0225299 | A1* | 8/2018 | Gupta | G06F 16/1744 |
| 2018/0268567 | A1* | 9/2018 | Hart | G06F 16/51 |
| 2019/0087247 | A1* | 3/2019 | Chakraborty | H04L 69/08 |
| 2019/0259468 | A1* | 8/2019 | Ojard | G16B 30/10 |
| 2020/0256902 | A1* | 8/2020 | DeCamp | G01R 21/06 |
| 2020/0356849 | A1* | 11/2020 | Xu | G06N 3/08 |
| 2020/0409915 | A1* | 12/2020 | Agrawal | G06F 16/215 |
| 2021/0263920 | A1* | 8/2021 | Jones | G06F 16/245 |
| 2021/0280051 | A1* | 9/2021 | Bingham | G08B 31/00 |
| 2021/0374683 | A1* | 12/2021 | Park | G06Q 10/1095 |
| 2021/0407298 | A1* | 12/2021 | Murphy | G08G 1/166 |
| 2022/0016455 | A1* | 1/2022 | Tohidi | G08B 31/00 |
| 2022/0198715 | A1* | 6/2022 | Wilczynski | G06N 3/045 |
| 2022/0198741 | A1* | 6/2022 | Viitanen | G06T 1/60 |
| 2023/0064112 | A1* | 3/2023 | Wang | G06Q 10/105 |
| 2023/0103939 | A1* | 4/2023 | Gabbamonte | G06F 16/27 |
| | | | | 707/634 |

* cited by examiner

APPROACHES OF INCIDENT MONITORING AND RESOLUTION

CROSS REFERENCE TO RELATED APPLICATIONS

This application claims the benefit under 35 U.S.C. § 119(e) of U.S. Provisional Application Ser. No. 63/327,282 filed Apr. 4, 2022, the content of which is incorporated by reference in its entirety into the present disclosure.

FIELD OF THE INVENTION

This disclosure relates to approaches of acquiring, synchronizing, merging, and/or filtering information related to incidents or events (hereinafter "incidents"), generating a representation such as an ontological representation or ontology (hereinafter "ontological representation" or "ontology") of a subset (e.g., a portion or an entirety of) the information, and implementing a response measure to resolve or address the incidents. These streamlined approaches implement a single integrated system to acquire information, analyze the information to separate signal from noise, triage the information, and determine and implement a response measure.

BACKGROUND

A proliferation of real-time data has increased awareness of incidents. Real-time data represented 15% of the datasphere in 2017, and by 2025, an estimated nearly 30 percent of data generated will be real-time, according to the International Data Commission (IDC). However, the ability to actually leverage or harness such real-time data remains limited due to delays between acquiring the information, identifying its relevance, determining a response measure, and deploying or implementing such a response measure. These delays may be attributed to a lack of synchronization among different information sources, such as, between the real-time data and contextual information that would impact determination and deployment of a response measure. Additionally, the information acquiring and response deployment mechanisms may be disconnected and/or siloed. A further hindrance is a lack of synchronization between different sources of real-time data. This lack of synchronization contributes to an inability to distinguish between signal and noise from information in the real-time data, which is exacerbated by the sheer amount of data involved. These drawbacks, among others, render current attempts to process and address potential incidents inefficient, ineffective, and possibly counterproductive. Therefore, a more streamlined and effective mechanism to evaluate information related to incidents, augmented with an integrated response mechanism, is able to prioritize and address incidents while properly allocating resources and expediting response efforts. Especially for urgent incidents, such a mechanism could prevent a calamity or other undesired outcomes.

SUMMARY

Various examples of the present disclosure can include computing systems, methods, and non-transitory computer readable media configured to implement an organizational framework that is suited to obtain information regarding an incident or a potential incident (hereinafter "incident"), generate a representation of the information, contextualize the information, and determine a response to address the incident or potential incident. In some examples, an incident may refer to any change, unexpected or anomalous event within an environment, such as a catastrophe, disaster, either natural or human-caused, an emergency, a cyber breach, or even minor incidents such as traffic delay, accident, congestion, construction, or closure. Such an end-to-end framework not only obtains information, but also analyzes and contextualizes the information to triage the incidents or potential incidents, in order to determine or implement a streamlined response measure, if applicable.

In some examples, the generating of a representation of the information may include converting or transforming (hereinafter "transforming") a format of the information into the representation, which may include an ontological representation or an ontology. A particular representation may be determined and may be dynamically changed based on the format. For example, the transforming may include mapping elements, attributes, or properties from the information into constructs of the representation, such as ontological constructs. In some examples, the format may include a schema, such as, without limitation, a database schema, a eXtensible Markup Language (XML) or XML-based schema, or object-oriented schema.

In some examples, the information may include a time, timestamp, or range of times or timestamps associated with the incident or potential incident, a location, an extent, a type, and/or other affected or potentially affected structures or entities from the incident or potential incident.

In some examples, the information may be from different sources and/or have different formats or schemas. The transforming may include merging the information from the different sources and transforming the merged information into a common representation.

In some examples, the transforming may include transforming a first format into the representation, obtaining additional information having a different format, and adjusting the representation to incorporate the additional information.

In some examples, the transforming may include detecting a change in the format and adjusting the representation based on the change in the format.

In some examples, the determining of the response may include implementing a tiered response mechanism or a hierarchy of responses based on score indicative of an inferred exigency of the incident or the potential incident.

In some examples, the inferred exigency may be based on a proximity between the location and the other affected structures or entities. In some examples, the inferred exigency may be based on a degree of overlap between the extent and the other affected structures or entities In some examples, the implementing of a response measure may include transmitting an indication of a response measure to a separate computing system, wherein the separate computing system implements the response measure. The response measure implemented may include, transmitting an alert to a device belonging to or associated with an affected entity, or shutting off or restricting access to an affected structure. The implementation of the response measure may protect privacy of any affected entities.

These and other features of the computing systems, methods, and non-transitory computer readable media disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for purposes of illustration and description only and are not intended as a definition of the limits of the invention.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the invention are utilized, and the accompanying drawings of which:

In FIG. 3, the additional information may indicate a resolution of an incident.

In FIG. 4, the additional information may include sensor data.

In FIG. 5, the additional information may include sensor data readings and extracted or inferred information from sensor data.

DETAILED DESCRIPTION

Figure 1:
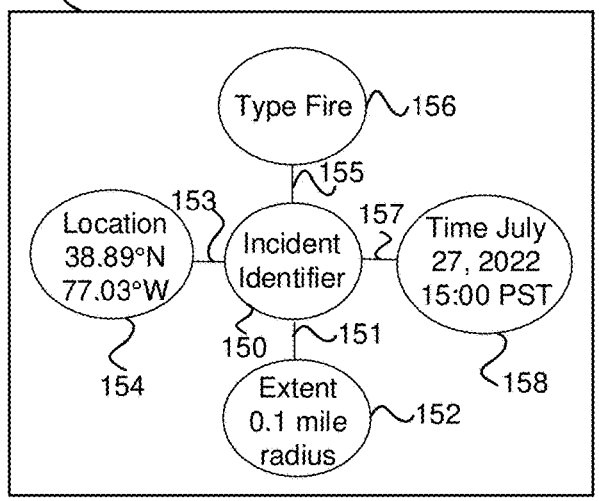
FIG. 1 illustrates an example environment or scenario (hereinafter "environment"), in accordance with various embodiments, of a computing system that obtains information regarding an incident. The computing system may be an end-to-end system which also merges or synchronizes additional information, augments the information with additional contextual information, and determines and/or implements a response.
Figure 1:
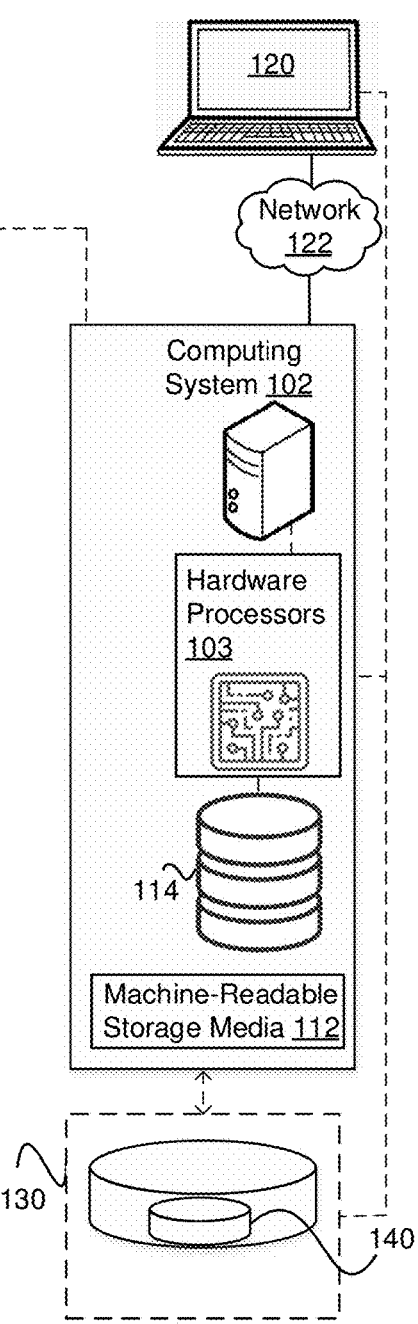

Conventional approaches of incident response are hampered either by incomplete information or disconnected information sources. For example, an event feed may indicate a presence of a fire or potential fire, but fail to reveal other relevant or contextual information such as a rate of spread and an intensity of the fire, and moisture content and wind speeds surrounding the fire. The event feed may further be devoid of relevant information to effectuate a response, such as, entities, including physical structures, infrastructure, assets, and persons affected or potentially affected by the fire. The aforementioned relevant or contextual information may either be unavailable, or be processed by a separate computing system from a computing system that receives the event feed. Such limitations result in ineffective and/or delayed incident response mechanisms, which fall short in inefficiently deploying available resources. Such mechanisms are unlikely to consistently effectuate a response that is commensurate with a priority or urgency level of an incident.

To address these and other shortcomings, a new end-to-end approach of incident analysis and response includes a computing system that obtains, receives, or ingests information regarding an incident, generates a representation of the information, analyzes the information, for example, to identify its relevance, if any, and determines or predicts a response mechanism based on the analysis. In some examples, the computing system outputs a visualization of the representation and implements the response mechanism. The information may come from different sources and have different formats. For example, the information may include event feeds or notifications and sensor information from different sensors. In some examples, the format may include a schema, such as, without limitation, a database schema, an eXtensible Markup Language (XML) or XML-based schema, or object-oriented schema. In some examples, the format may include unstructured information that is to be converted or transformed into a particular representation. Meanwhile, the different sensors may include sensors such as cameras, radars, Lidar sensors, thermometers, humidity sensors, Global Positioning System (GPS), Global Navigation Satellite System (GNSS) sensors, or any other sensors that measure, estimate, or determine attributes or parameters associated with an incident. The sensor information may be manifested as text, media, such as video, audio, images, or a combination thereof. The sensor information may be fused from different sensors, for example, from both camera and Lidar sensors, or from GPS and Inertial Measurement Unit (IMU) sensors.

Therefore, the computing system may merge or synchronize information of different formats from different sources, thereby leveraging or utilizing a greater corpus of information in order to determine or predict a more effective and accurate response. In addition, the information may be augmented by contextual information such as entities that may be affected by the incident. These entities may include physical structures such as buildings or facilities, infrastructure such as computer networks or wireless networks, and persons. From the contextual information, noise from the information obtained regarding the incident may be more effectively filtered out. As a result, the response may be targeted to specific entities depending on priority or urgency. Additionally, because the contextual information is stored or housed within the end-to-end system, delays that would otherwise result from having to retrieve the contextual information from other systems would be eliminated.

FIG. 1 illustrates an example environment 100, in accordance with various embodiments, of an end-to-end computing system that receives and processes information regarding or related to an incident in order to determine and/or implement a response. The example environment 100 can include at least a computing system 102 and at least one computing device 120. In general, the computing device 120 may be operated by an entity such as a user. The user may submit a request or query through the computing device 120. In some examples, the user may be an administrative user that provides input or modifications to any of the outputs from the computing system 102. In some examples, the computing device 120 may visually render any outputs generated from the computing system 102. In general, the user can interact with the computing system 102 directly or over a network 122, for example, through one or more graphical user interfaces and/or application programming interfaces.

The computing system 102 and the computing device 120 can each include one or more processors and memory. Processors can be configured to perform various operations by interpreting machine-readable instructions, for example, from a machine-readable storage media 112. The processors can include one or more hardware processors 103 of the computing system 102. The hardware processors 103 may further be connected to, include, or be embedded with logic 113 which, for example, may include protocol that is executed to carry out the functions of the hardware processors 103. These functions may include ingesting or obtaining information regarding an incident, generating a representation of the information, analyzing and/or contextualizing the information, and determining and/or implementing a streamlined response. The computing system 102 may be connected to or associated with one or more data sources or data platforms (hereinafter "data platforms" 130). The data platforms 130 may include, or be capable of obtaining, contextual information that is utilized to effectuate a response. For example, the contextual information may include locations, attributes, and other information of particular entities such as physical structures, infrastructure, or persons. In particular, the contextual information may include location coordinates such as GPS latitude and/or longitude coordinates of particular entities. The contextual information may include information of devices such as electronic devices, and/or readers such as badge readers associated with persons. The contextual information may further include information or resources obtained from external sources such as airline records or other travel records. Thus, the contextual information may elucidate particular entities to be addressed or targeted during a response. As a result of the synchronization of the contextual information, a targeted response may be undertaken to reduce or eliminate waste of resources that do not actually mitigate or resolve the incident. Moreover, the contextual information does not need to be separately ingested or obtained, thereby conserving time and computing resources. This synchronization constitutes a technical effect.

The data platforms 130 may be divided into at least one segment 140. Although one segment 140 is shown for purposes of simplicity, the data platforms 130 may be understood to include multiple segments. As an example, one segment may include, and/or store data related to, a particular external source such as badge reader information, or airline records. Therefore, each segment may be particularly tailored to or restricted to storage and management of resources having a particular purpose and/or of a particular subject matter. Such segregation of resources in different segments may be desirable in scenarios in which access to, dissemination, and/or release of resources from one external source are to be determined and managed separately from those resources from other external sources, and only specific users may have access to one or more particular segments of resources.

Additionally or alternatively, the data platforms 130 may be divided into multiple segments in order to sequester access to particular information based on access control levels or privileges of each of the segments. For example, each segment may be, or be labelled as, accessible only by persons (e.g., users operating the computing device 120) having one or more particular access control levels or privileges. The demarcation of information within the data platforms 130 into segments, such as the segment 140, provides clear delineations, classification levels and/or access constraints of each of the segments. As an example, one segment may have a classification level of "confidential," while another segment may have a classification level of "top secret." A classification level of a segment may indicate or define a maximum classification level of information or resources that are permitted within the segment. In particular, if one segment has a classification level of "confidential," then information or resources classified up to and including, or, at or below a level of, "confidential" may be permitted to be ingested into the segment while information or resources classified at a level higher than "confidential" may be blocked or restricted from being ingested into the segment. In some examples, the classification levels may be inherited or transferred from already defined classification levels of the external sources. In some examples, the classification levels may be automatically or manually set.

In general, the logic 113 may be implemented, in whole or in part, as software that is capable of running on one or more computing devices (e.g., the computing device 120) or systems such as the hardware processors 103, and may be read or executed from the machine-readable storage media 112. In one example, the logic 113 may be implemented as or within a software application running on one or more computing devices (e.g., user or client devices such as the computing device 120) and/or one or more servers (e.g., network servers or cloud servers). The logic 113 may, as alluded to above, perform functions of ingesting or obtaining information regarding an incident, generating a representation of the information, analyzing and/or contextualizing the information, and determining and/or implementing a streamlined response. Additionally, the logic 113 may receive an input or query, for example from the computing device 120, and analyze or evaluate the input. The logic 113 may generate an output, which provides information and/or a visualization, and or perform a particular action such as changing a criteria of determining a response to analyzing the information, based on the input or query.

Meanwhile, the logic 113 may determine or ensure that an input or request 140 is proper and conforms to the constraints and/or classification levels. In some embodiments, the logic 113 may ensure that access to a particular resource would conform to the constraints and/or classification levels for the user and based on a comparison of the constraints and/or classification levels of a particular segment. The logic 113 may ensure that a user requesting access to or ingestion of a resource belonging to a particular segment has appropriate permissions, such as access or editing permissions, or authorization on that resource. If not, the logic 113 may redact a portion of the resources that exceed or violate the constraints and/or classification levels for the user. In another exemplary manifestation, the logic 113 may determine whether, and/or to what degree, a user requesting access to a particular resource is actually authorized to do so. For example, the logic 113 may determine that even though a user satisfies a clearance level corresponding to a classification of a particular segment, the user may not satisfy a dissemination or release control. The logic 113 may implement restrictions such as prohibiting the user from viewing or editing contents of resources within the segment 140, prohibiting the user from viewing an existence of resources within the segment 140, and/or generating tearlines to purge contents of resource portions that fail to satisfy a dissemination or release control.

In some embodiments, the computing system 102 may further include a database or other storage (hereinafter "database") 114 associated with the hardware processors 103. In some embodiments, the database 114 may be integrated internally with the hardware processors 103. In other embodiments, the database 114 may be separate from but communicatively connected to the hardware processors 103. Furthermore, the database 114 may be integrated with, or alternatively, spatially separated from, the data platforms 130. The database 114 may store information such as the information that is ingested or obtained from incidents, and data generated from the hardware processors 103, such as analyze, merged, or evaluated information, and inferences of the information such as scores or metrics indicative of exigency levels, and confidence levels of the inferences. In some instances, one or more of the hardware processors 103 may be combined or integrated into a single processor, and some or all functions performed by one or more of the hardware processors 103 may not be spatially separated, but instead may be performed by a common processor.

FIG. 1 illustrates an exemplary operation of the logic 113 in obtaining information 141 regarding an incident. Here, a report of a fire is illustrated for exemplary purposes, but the incident may encompass any type, including but not limited to any change, unexpected or anomalous event within an environment, such as a catastrophe, disaster, either natural or human-caused, an emergency, a cyber breach, or even minor incidents such as traffic delay, accident, congestion, construction, or closure. The logic 113 may obtain the information 141 via one or more application programming interfaces (APIs). Although the information 141 is illustrated as a tabular format or schema for exemplary purposes, the information 141 may be manifested in any format, such as an unstructured format, an eXtensible Markup Language (XML) or XML-based schema, or object-oriented schema, to name a few non-limiting examples. The logic 113 may handle a wide range of formats. The logic 113 may transform the information 141 into a representation 145. The representation 145 may include a ontology or an ontological representation, and may encompass an incident identifier 150, and attributes of the incident including an extent 152 (e.g., how far the incident has spread, such as a radius) of the incident, a location 154 (e.g., either in geographic latitude and longitude coordinates, such as World Geodetic System (WGS84) coordinates) or in text format) of the incident, a type 156 (e.g., a classification or categorization) of the incident, and a time 158 (e.g., a time of reporting or updating) of the incident. The incident identifier 150 may be linked to the attributes via links 151, 153, 155, and 157. In order to transform the information 141 into the representation 145, the logic 113 may determine a mapping between a format of the information 141 and the representation 145. For example, the transforming may include mapping elements, attributes, nodes, or properties from the information 141 into constructs of the representation, such as ontological constructs. Here, the logic 113 may determine a schema to ontology mapping. The mapping may include a conceptual graph, in which elements, such as an identification or indication that an incident has occurred, from the information 141 are mapped into respective classes of the ontology. Meanwhile, attributes, such as type, location, time, and extent, from the information 141 may be mapped to respective properties or attributes of the ontology. The representation 145 may include one or more heavyweight ontologies, which include cardinality and/or transitivity constraints, refined statements and axioms, and/or lightweight ontologies.

Figure 2:
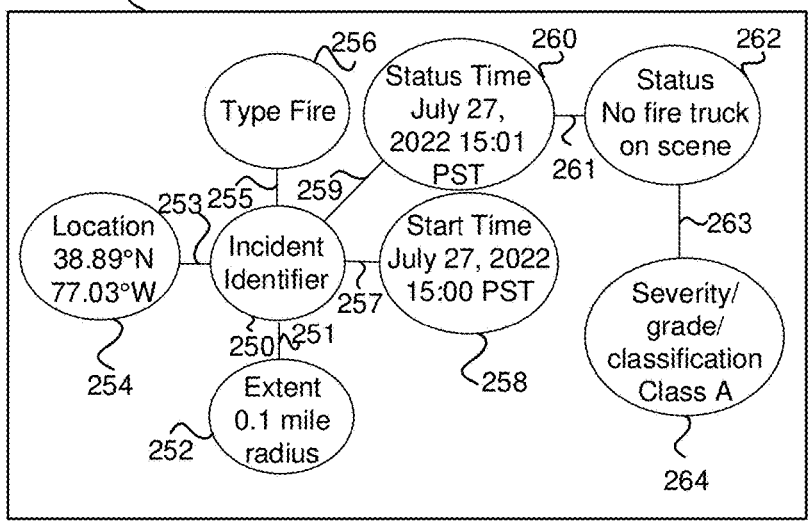
FIG. 2 illustrates, in accordance with various embodiments, exemplary operations of merging or synchronizing additional information regarding an incident and updating a previous representation, or ontology.
Figure 2:
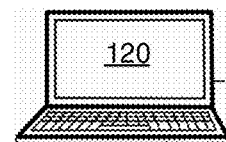
Figure 2:
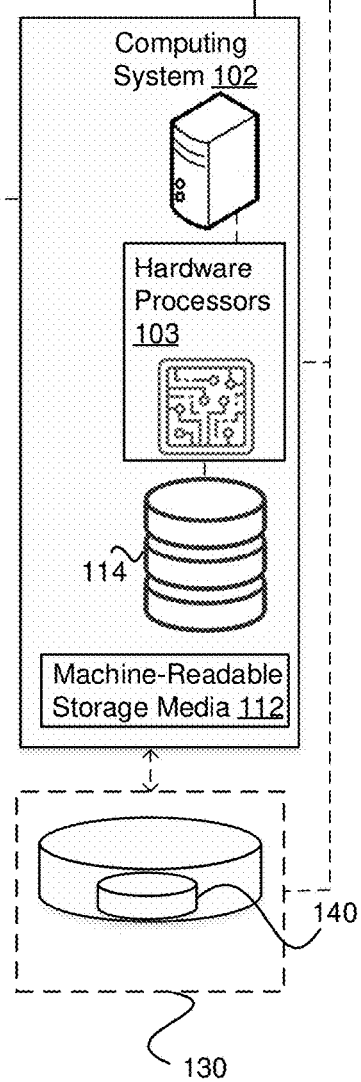

FIG. 2 illustrates an exemplary environment 200, including an operation of the logic 113 in merging or synchronizing (hereinafter "synchronizing") additional information regarding an incident and updating the previous representation 145 as illustrated in FIG. 1. Relevant principles described with respect to FIG. 1 are also applicable to FIG. 2, and FIG. 2 expands upon FIG. 1. In FIG. 2, the logic 113 may further obtain or ingest additional information 241. As a result, the previous representation 145 may be augmented to synchronize the additional information 241. The additional information 241 may include further details of the incident that were previously missing and/or a status update regarding the incident. The logic 113 may determine that the additional information 241 pertains to a common incident as the information 141 based on an amount of overlap, or specific fields that overlap, between the information 141 and the additional information 241. For example, these fields include a type, a location, an extent, and times being within a threshold range, here, one minute, of each other. For example, the logic 113 may generate a bridge table, or retrieve a bridge table, indicating a relationship between the information 141 and the additional information 241. The logic 113 may then determine that the additional information 241 includes a status update at a more recent time compared to the information 141, and further details including an estimated severity. The estimated severity may be provided by an external source rather than being determined by the logic 113, and may be distinguished from a score indicative of an exigency of an incident, as determined by the logic 113 and described in FIGS. 9-15. The estimated severity, however, may be one criterion used to determine the score. The logic 113 may then update the previous representation 145 based on the additional information 241. In some examples, the logic 113 may preferably update the previous representation 145 from FIG. 1 rather than generate a new representation, because a new representation may not incorporate manual changes made within the previous representation 145.

In FIG. 2, an updated representation 245 may include an ontology or an ontological representation, and may encompass an incident identifier 250, and attributes of the incident including an extent 252 (e.g., how far the incident has spread, such as a radius) of the incident, a location 254 (e.g., either in geographic latitude and longitude coordinates, such as World Geodetic System (WGS84) coordinates or in text format) of the incident, a type 256 (e.g., a classification or categorization) of the incident, a start time 258 (e.g., a time that the incident was initially reported) of the incident, a status time 260 (e.g., indicating an updated, or most recent status, of the incident), a status 262 (e.g., indicating any response measures already undertaken or not undertaken), and an estimated severity, grade, or classification 264 of the incident. The incident identifier 250 may be linked to the attributes via links 251, 253, 255, 257, 259, 261, and 263. In order to update or synchronize the previous representation 145 to incorporate the additional information 241, the logic 113 may determine a mapping between a format of additional fields or entries of the additional information 241 and the updated representation 245, and/or changes in previous mapping between the information 141 and the previous representation 145. Here, the logic 113 may determine an updated schema to ontology mapping. In particular, the transforming may include changing the previous attribute of "time" to "start time," while adding attributes "status time", "status," and "severity."

Figure 3:
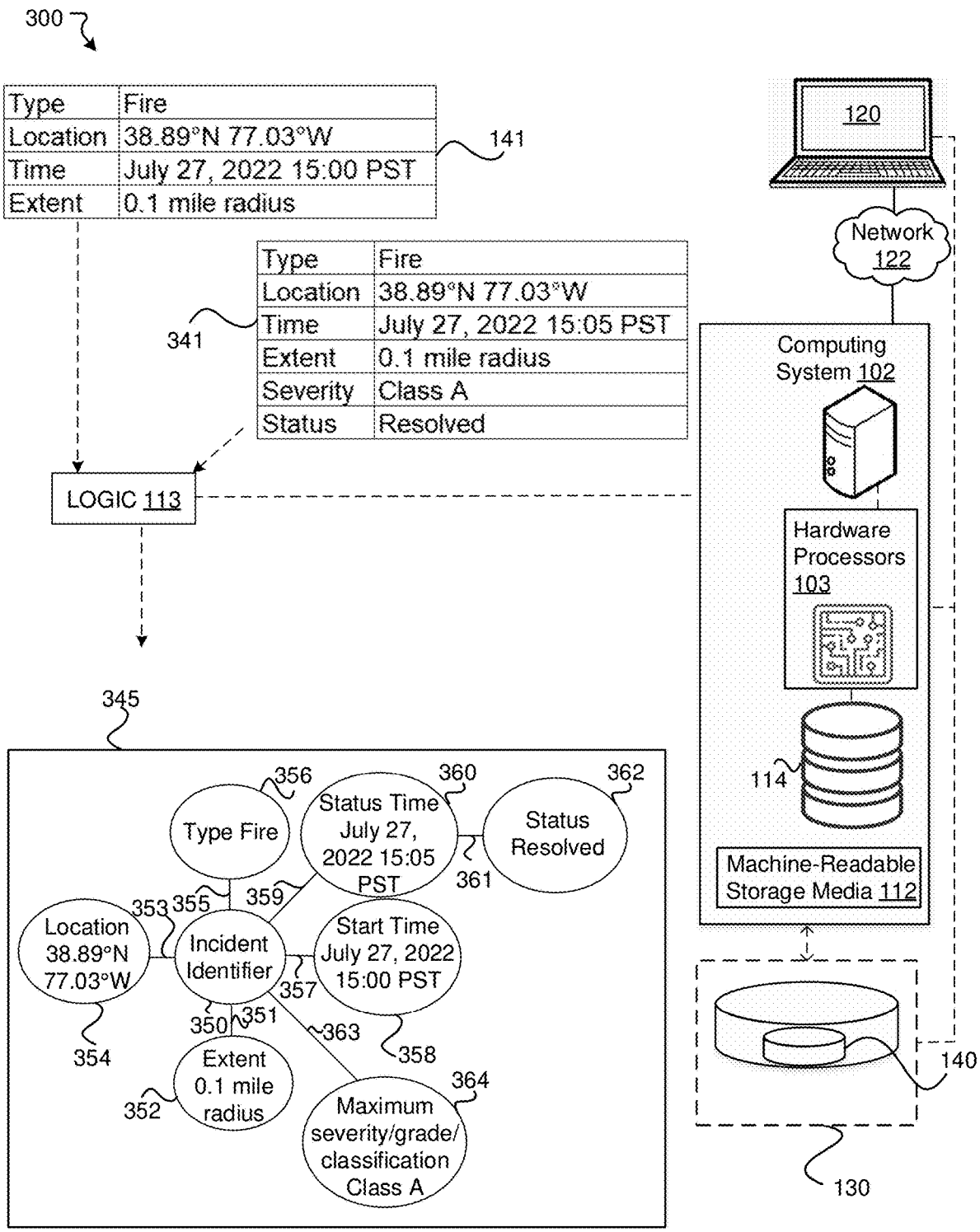
FIG. 3 illustrates, in accordance with various embodiments, exemplary operations of merging or synchronizing additional information regarding an incident and updating a previous representation, or ontology.

FIG. 3 illustrates an exemplary environment 300, including an operation of the logic 113 in merging or synchronizing (hereinafter "synchronizing") additional information regarding an incident and updating the previous representation 145 as illustrated in FIG. 1. Relevant principles described with respect to FIG. 1 and FIG. 2 are also applicable to FIG. 3, and FIG. 3 expands upon FIG. 1. Operations illustrated in any of FIGS. 1-3 may be combined as applicable. In FIG. 3, the logic 113 may further obtain or ingest additional information 341 regarding a resolution of the incident. As a result, the previous representation 145 may be augmented to synchronize the additional information 341. The additional information 341 may include further details of the incident that were previously missing and/or a status update regarding the incident. The logic 113 may determine that the additional information 341 pertains to a common incident as the information 141 based on an amount of overlap, or specific fields that overlap, between the information 141 and the additional information 341. The logic 113 may then determine that the additional information 341 includes a status update at a more recent time compared to the information 141, and further details including an estimated severity. The logic 113 may then update the previous representation 145 based on the additional information 341. In some examples, the logic 113 may preferably update the previous representation 145 from FIG. 1 rather than generate a new representation, because a new representation may not incorporate any manual changes made within the previous representation 145.

In FIG. 3, an updated representation 345 may include an ontology or an ontological representation, and may encompass an incident identifier 350, and attributes of the incident including an extent 352 (e.g., how far the incident has spread, such as a radius) of the incident, a location 354 (e.g., either in geographic latitude and longitude coordinates, such as World Geodetic System (WGS84) coordinates or in text format) of the incident, a type 356 (e.g., a classification or categorization) of the incident, a start time 358 (e.g., a time that the incident was initially reported) of the incident, a status time 360 (e.g., indicating an updated, or most recent status, of the incident), a status 362 (e.g., indicating any response measures already undertaken or not undertaken), and a severity, grade, or classification 364 of the incident. The incident identifier 350 may be linked to the aforementioned attributes via links 351, 353, 355, 357, 359, 361, and 363.

In order to update or synchronize the previous representation 145 to incorporate the additional information 341, the logic 113 may determine a mapping between a format of additional fields or entries of the additional information 341 and the updated representation 345, and/or changes in previous mapping between the information 141 and the previous representation 145. Here, the logic 113 may determine an updated schema to ontology mapping. In particular, the transforming may include changing the previous attribute of "time" to "start time," while adding attributes "status time", "status," and "maximum severity/grade/classification." The logic 113 may infer that the "severity" entry or field within the additional information 341 corresponds to a maximum severity at a previous time instance, rather than a current severity because the current status of the incident is indicated as "resolved." Thus, by incorporating this additional information 341, and/or upon confirming that the incident is indeed resolved, the logic 113 may determine that no further response is to be implemented, thereby conserving computing resources that would otherwise be expended in determining a response, and actually implementing the response.

Figure 4:
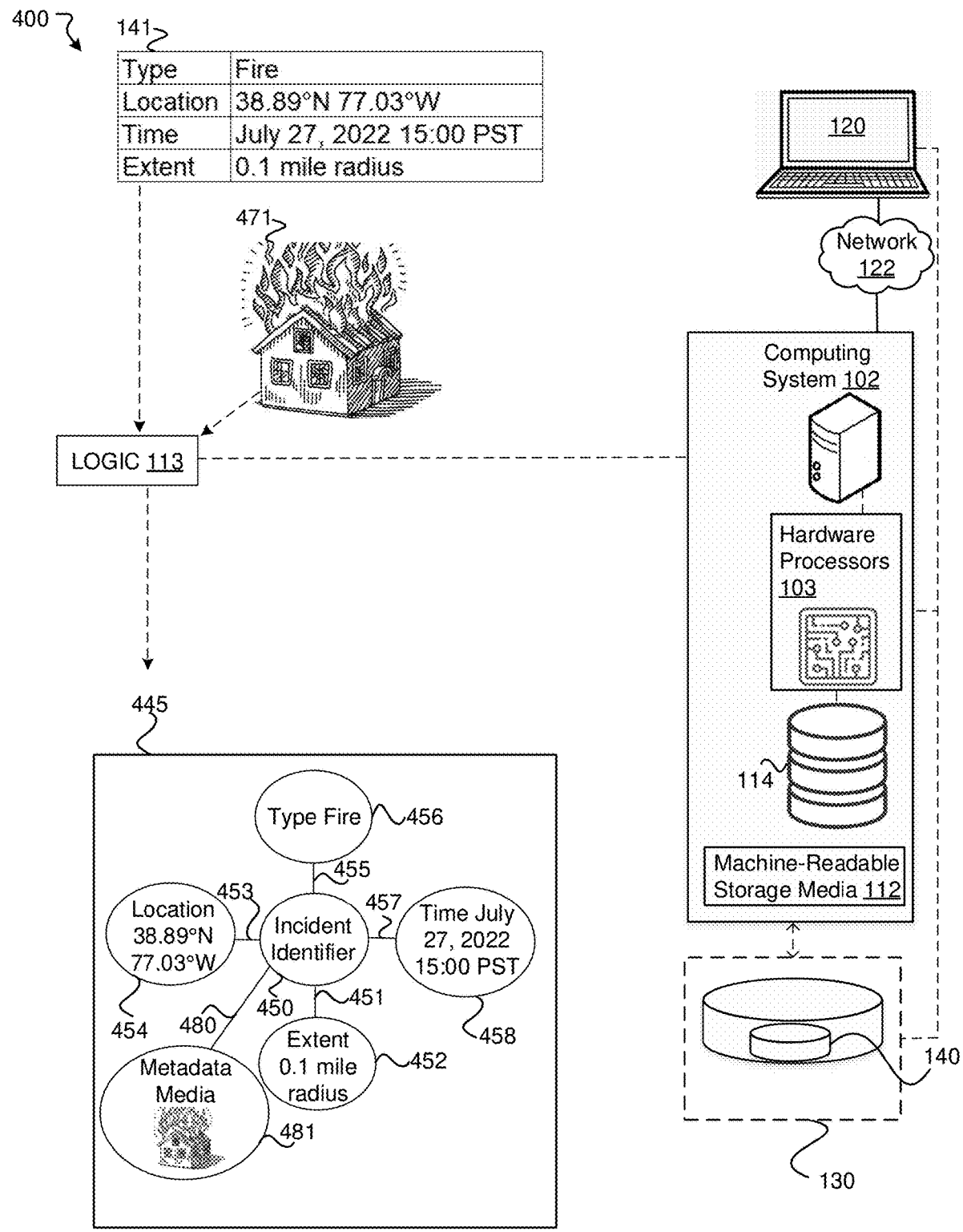
FIG. 4 illustrates, in accordance with various embodiments, exemplary operations of merging or synchronizing additional information regarding an incident and updating a previous representation, or ontology.

FIG. 4 illustrates an exemplary environment 400, including an operation of the logic 113 in merging or synchronizing (hereinafter "synchronizing") additional sensor data regarding an incident and updating the previous representation 145 as illustrated in FIG. 1. Relevant principles described with respect to FIGS. 1-3 are also applicable to FIG. 4, and FIG. 4 expands upon FIG. 1. Operations illustrated in any of FIGS. 1-4 may be combined as applicable. In FIG. 4, the logic 113 may further obtain or ingest additional sensor data 471 regarding the incident. The additional sensor data 471 is illustrated in FIG. 4 as media, but the additional sensor data 471 may also be manifested as sensor readings such as humidity, pressure, temperature, or other relevant parameters. The media may encompass images, videos, audios, or a combination thereof. As a result, the previous representation 145 may be augmented to synchronize the additional sensor data 471. The logic 113 may determine that the additional sensor data 471 actually pertains to a common incident as the information 141 based on an amount of overlap between the information 141 and metadata from the additional sensor data 471. For example, the metadata from the additional sensor data 471 may indicate a location, a time, and/or further descriptions pertaining to the additional sensor data 471.

The logic 113 may then update the previous representation 145 to incorporate the additional sensor data 471. In some examples, the logic 113 may preferably update the previous representation 145 from FIG. 1 rather than generate a new representation, because a new representation may not incorporate any manual changes made within the previous representation 145. In FIG. 4, an updated representation 445 may include an ontology or an ontological representation, and may encompass an incident identifier 450, and attributes of the incident including an extent 452 (e.g., how far the incident has spread, such as a radius) of the incident, a location 454 (e.g., either in geographic latitude and longitude coordinates, such as World Geodetic System (WGS84)

coordinates or in text format) of the incident, a type 456 (e.g., a classification or categorization) of the incident, a time 458 (e.g., a time that the incident was initially reported or updated) of the incident, and metadata 481 corresponding to the additional sensor data 471. In order to update or synchronize the previous representation 145 to incorporate the additional sensor data 471, the logic 113 may update the previous representation 145 to include an additional attribute, property, or field. Here, the additional sensor data 471 may be incorporated into the updated representation 445 as metadata, or some other property or attribute linked to the incident identifier 450. Thus, by incorporating this additional sensor data 471, the logic 113 may consolidate sensor data and event feed information to facilitate further analysis of the incident, either by the computing system 102, a separate computing system or platform, or manual analysis by an operator or user of the computing device 102.

Figure 5:
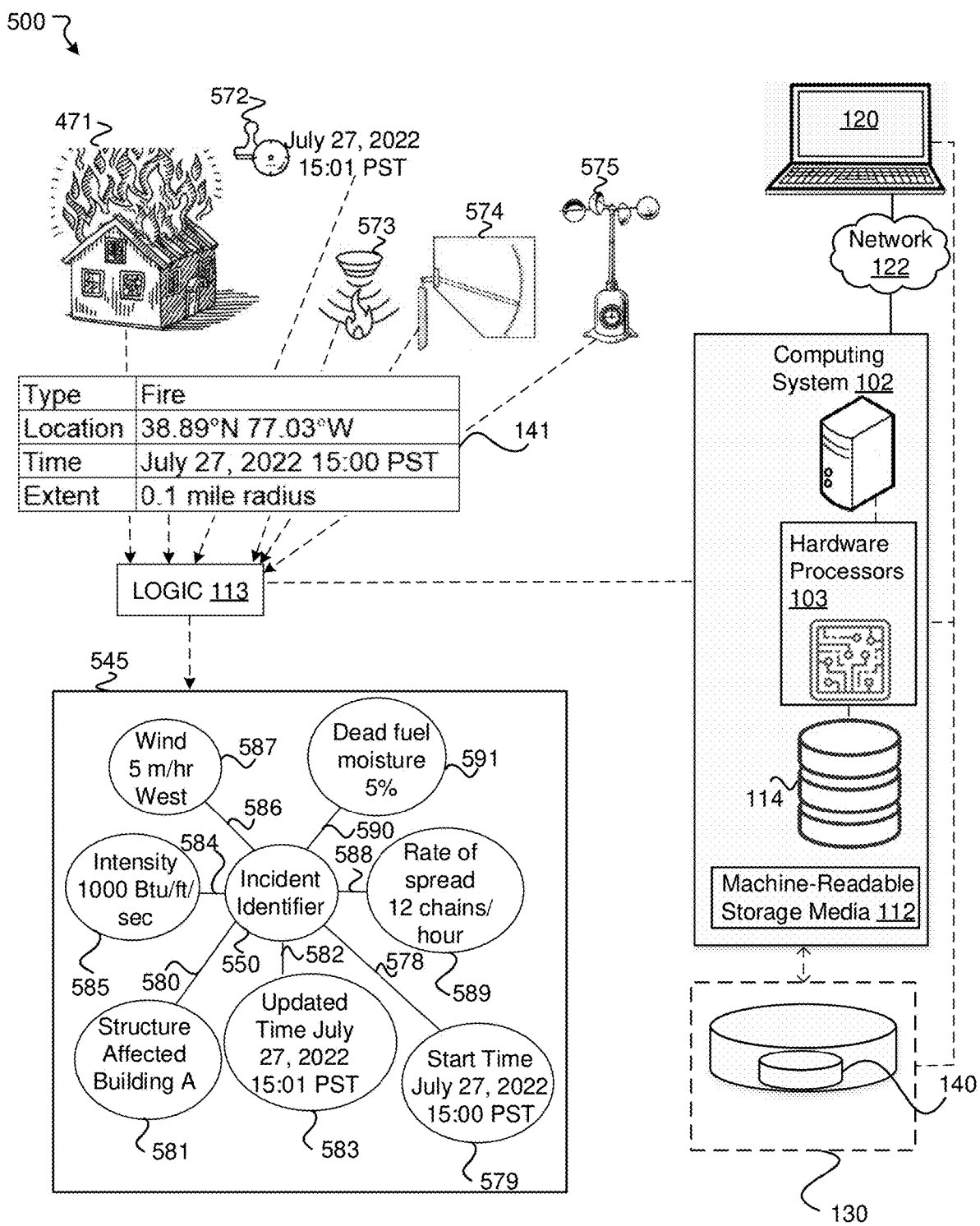
FIG. 5 illustrates, in accordance with various embodiments, exemplary operations of merging or synchronizing additional information regarding an incident and updating a previous representation, or ontology.

FIG. 5 illustrates an exemplary environment 500, including an operation of the logic 113 in merging or synchronizing (hereinafter "synchronizing") additional sensor data regarding an incident and updating the previous representation 145 as illustrated in FIG. 1. Relevant principles described with respect to FIGS. 1-4 are also applicable to FIG. 5, and FIG. 5 expands upon FIGS. 1 and 4. Operations illustrated in any of FIGS. 1-5 may be combined as applicable. In FIG. 4, the logic 113 may further obtain or ingest the additional sensor data 471 regarding the incident. Additionally or alternatively, the logic 113 may further obtain or ingest sensor readings from one or more different sensors including, as non-limiting examples, a flame sensor or fire sensor (hereinafter "flame sensor") 573 to detect an intensity of a fire, a moisture sensor 574, and/or an anemometer 575 (hereinafter referred to collectively as "sensors") to measure wind speed. Other non-limiting examples of sensor data readings may include humidity, pressure, temperature, or other relevant parameters.

As an alternative to, or in addition to, incorporating the additional sensor data 471 as metadata within the updated representation 445, as illustrated in FIG. 4, the logic 113 may extract or infer information from the additional sensor data 471 within an updated representation 545. For example, the logic 113 may extract a timestamp 572 associated with the additional sensor data 471, and include an additional attribute, property, or field (hereinafter "attribute") within the updated representation 545 that is indicative of a value within the timestamp 572. In FIG. 5, this additional attribute is manifested as an updated time 583 within the updated representation 545. Moreover, the logic 113 may utilize image recognition techniques to determine other information from the additional sensor data 471, such as, entities affected by the incident. For example, if a frame of an image illustrates a particular building at, or within a threshold distance of, the incident, then the logic 113 may predict, infer, or determine that the particular building is a structure affected by the incident. The logic 113 may implement techniques to extract relevant information from the additional sensor data, including techniques described in United States Publication Number 2022/0198715, filed on Dec. 17, 2021, which is hereby incorporated by reference in its entirety. The extracted relevant information may be integrated or incorporated into the updated representation 545 as additional attributes or fields. For example, the logic 113 may add an attribute within the updated representation 545 indicative of the particular building affected by the incident, within an attribute indicating structure affected 581.

The logic 113 may further augment the updated representation using the information from the one or more sensors, including an intensity 585, a wind speed or other parameter 587, a rate of spread 589, and a dead fuel moisture 591. A start time 579 may have been originally obtained from the information 141. As a result, the previous representation 145 may be augmented to synchronize information extracted from the additional sensor data 471 as well as sensor readings from the sensors 573, 574, and 575. The logic 113 may determine that the additional sensor data 471 and readings from the sensors 573, 574, and 575 actually pertain to a common incident as the information 141 based on an amount of overlap between the information 141, and metadata from the additional sensor data 471 and from the sensors 573, 574, and 575. For example, the metadata from the additional sensor data 471 and from the sensors 573, 574, and 575 may indicate a location, a time, and/or further descriptions pertaining to the additional sensor data 471 and from the sensors 573, 574, and 575.

The logic 113 may then update the previous representation 145 to incorporate metadata or other information extracted from the additional sensor data 471 and from readings of the sensors 573, 574, and 575. In some examples, the logic 113 may preferably update the previous representation 145 from FIG. 1 rather than generate a new representation, because a new representation may not incorporate any manual changes made within the previous representation 145. In FIG. 5, the updated representation 545 may include an ontology or an ontological representation, and may encompass an incident identifier 550, and attributes of the incident including a start time 579, the structure affected 581, the updated time 583 indicating a time at which the incident was updated or a most recent update, the intensity 585, the wind speed or other parameter 587, the rate of spread 589, and the dead fuel moisture 591. Some of the previous attributes in FIG. 1 are not shown in FIG. 5 for simplicity. The aforementioned attributes may be linked to the incident identifier 550 by links 578, 580, 582, 584, 586, 588, and 590. Therefore, the logic 113 extracts and/or synchronizes or consolidates additional information from the additional sensor data 471 and readings from the sensors 573, 574, and 575 in order to better inform an assessment of the incident and more effectively determine, plan, or implement a response.

Figure 6:
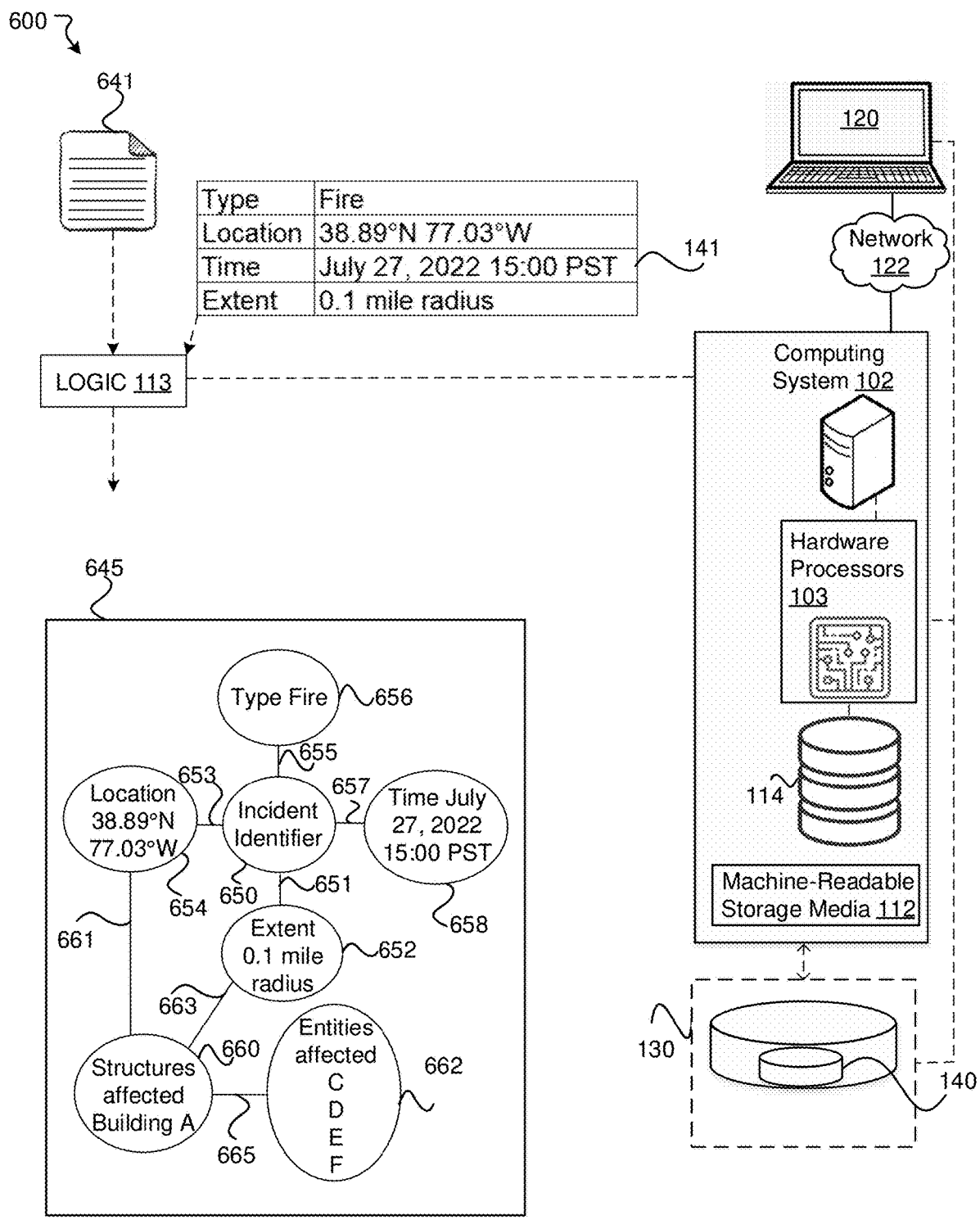
FIG. 6 illustrates, in accordance with various embodiments, exemplary operations of merging or synchronizing additional contextual information regarding an incident and updating a previous representation, or ontology.

FIG. 6 illustrates an exemplary environment 600, including an operation of the logic 113 in merging or synchronizing (hereinafter "synchronizing") additional contextual information 641 regarding an incident and updating the previous representation 145 as illustrated in FIG. 1. Relevant principles described with respect to FIGS. 1-5 are also applicable to FIG. 6, and FIG. 6 expands upon FIG. 1. Operations illustrated in any of FIGS. 1-6 may be combined as applicable. In FIG. 6, the logic 113 may further obtain the additional contextual information 641, which may be from the data platforms 130, as described in FIG. 1.

For example, the additional contextual information 641 may include locations, attributes, and other information of particular entities such as physical structures, infrastructure, or persons. In particular, the additional contextual information 641 may include location coordinates such as GPS latitude and/or longitude coordinates of particular entities. The additional contextual information 641 may include information of devices such as electronic devices, and/or readers such as badge readers associated with persons. The additional contextual information 641 may further include information or resources obtained from external sources such as airline records or other travel records which may indicate current or predicted future locations of persons. Thus, the additional contextual information 641 may guide a response towards particular relevant entities to be addressed or targeted. As a result of the synchronization of the additional contextual information 641, a targeted response may be undertaken to reduce or eliminate waste of resources that do not actually mitigate or resolve the incident. Moreover, the additional contextual information 641 does not need to be separately ingested or obtained, thereby conserving time and computing resources.

In FIG. 6, the additional contextual information 641 may indicate any structures such as buildings or infrastructure located within a threshold distance of a location of the incident (e.g., 38.89° N 77.03° W), and/or within an extent (e.g., 0.1 mile radius) of the incident. The additional contextual information 641 may further indicate entities such as persons affected. For example, these entities may include persons associated with the aforementioned buildings or infrastructure, such as, persons who were identified within sensors and/or logs associated with the aforementioned buildings or infrastructure. These persons may include those who have accessed the buildings or infrastructure using a badge reader or a key card within a threshold timeframe, or accessed a computer or wireless network associated with the buildings or infrastructure, and/or persons who have access to the buildings or infrastructure. The logic 113 may augment the previous representation 145 to incorporate this additional contextual information 641, as new attributes or fields (hereinafter "attributes") 660 and 662, indicating structures affected and entities affected, respectively, within an updated representation 645. Therefore, the updated representation 645 consolidates relevant information to provide a more comprehensive perspective of an incident, which improves an efficiency and efficacy of a response.

In FIG. 6, the updated representation 645 may include an ontology or an ontological representation, and may encompass an incident identifier 650, and attributes of the incident including an extent 652, a location 654, a type 656, a time 658, the structures affected 660, and the entities affected 662. The aforementioned attributes may be linked to the incident identifier 650 by links 651, 653, 655, 657, 661, 663, and 665.

Figure 7:
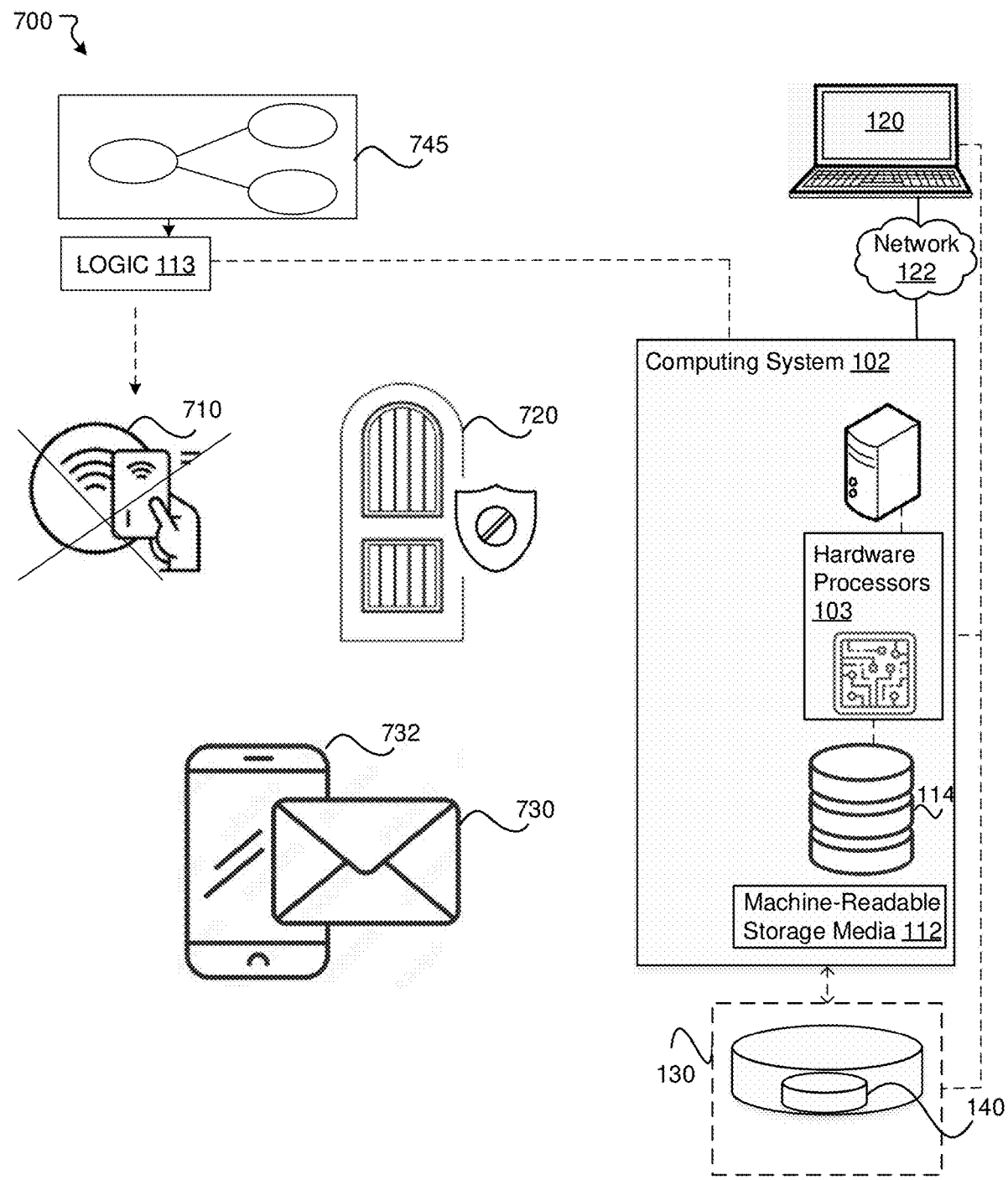
FIG. 7 illustrates, in accordance with various embodiments, exemplary operations of determining and/or implementing a response and focuses on electronic-based responses, using representations or ontologies in any of FIGS. 1-7.

FIG. 7 illustrates an exemplary environment 700, including an operation of the logic 113 in determining and/or implementing a response using a representation 745, which may be implemented as either the representation 145 of FIG. 1 or any of the updated representations 245, 345, 445, 545, or 645 in FIGS. 2-6, respectively. The logic 113 may determine a response to be implemented or executed by the computing system 102, or transmit the determined response to a separate computing system, which implements the determined response. A determination of whether to implement a response and a particular response to be implemented may be based on a score indicating a gravity, exigency, urgency, or priority of an incident, as will be described in more detail in FIGS. 9-15. For example, the response may include deactivating a scanner or reader (hereinafter "reader") 710 associated with or belonging to a structure affected. The structure affected may be determined to be within a threshold distance from an incident, and/or within an extent of an incident, as described in FIGS. 5-6. For example, the reader may include a key card or badge reader. Such deactivation may prevent persons from entering a high-risk structure. Another response may include locking an entrance or door (hereinafter "door") 720 associated with or belonging to a structure affected. Yet another response may include transmitting one or more messages 730 to one or more entities affected by the incident. For example, the transmission may entail transmitting one or more warnings or alerts to devices 732 associated with the entities affected. In some examples, the transmission may be promulgated to all entities affected by the incident, such as, all entities that are associated with, or recorded in, logs of the affected structure, no matter a current location of the entities. In some examples, the transmission may be limited to only certain entities affected by the incident, which may be determined, for example, based on a frequency at which the entities access the structure affected, and/or a current distance of the entities from the structure affected, among other factors. In particular, the transmission may be limited to only entities who access the structure affected at greater than a threshold frequency (e.g., a certain number of times per week). Additionally or alternatively, the transmission may be limited to only entities who are within a certain threshold distance from the structure affected (e.g., a certain number of miles within the structure affected). The logic 113 may access emergency systems such as emergency notification systems in order to identify and manage communications with entities without compromising privacy. The responses determined or implemented as described in FIG. 7 are enabled by the synchronization of different information sources and contextual information, as described in FIGS. 2-6.

Figure 8:
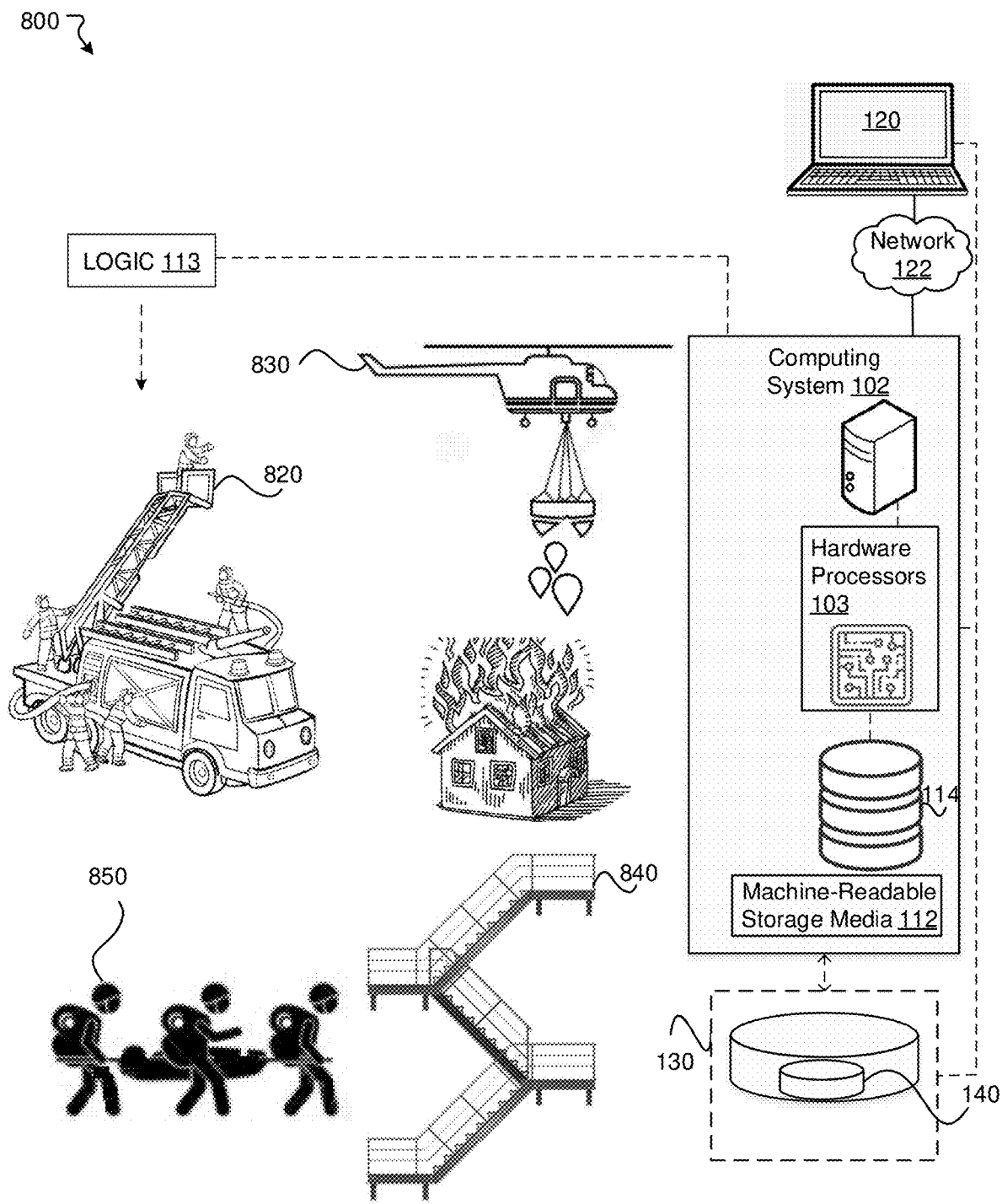
FIG. 8 illustrates, in accordance with various embodiments, exemplary operations of determining and/or implementing a response and focuses on physical-based responses, using representations or ontologies in any of FIGS. 1-7.

FIG. 8 illustrates an exemplary environment 800, including an operation of the logic 113 in determining and/or implementing a response using a representation 745, which may be implemented as either the representation 145 of FIG. 1 or any of the updated representations 245, 345, 445, 545, or 645 in FIGS. 2-6, respectively. In contrast to FIG. 7, which illustrates electronic responses, FIG. 8 illustrates physical responses, which may be implemented in conjunction with or alternatively to the responses described in FIG. 7.

The logic 113 may determine a response to be implemented or executed by the computing system 102, or transmit the determined response to a separate computing system, which implements the determined response. A determination of whether to implement a response and a particular response to be implemented may be based on a score indicating a gravity, exigency, urgency, or priority of an incident, as will be described in more detail in FIGS. 9-15. For example, the response may include deploying a fire truck 820, deploying a helicopter 830, deploying an evacuation procedure 840, and or deploying a rescue operation 850. In some examples, the logic 113 may determine an extent of a response, including, an amount of resources, such as physical resources including vehicles and/or tools, and an amount of human resources, based on the score corresponding to the incident. The logic 113 may transmit one or more notifications regarding the response to one or more entities affected by the incident. For example, the transmission may entail transmitting one or more notifications that a response is to be undertaken, and/or a particular response to be undertaken, devices associated with the one or more entities. The one or more entities may include all entities affected by the incident, such as, all entities that are associated with, or recorded in, logs of the affected structure. In some examples, the transmission may be limited to only certain entities affected by the incident, which may be determined, for example, based on a frequency at which the entities access the structure affected, and/or a current distance of the entities from the structure affected, among other factors. In particular, the transmission may be limited to only entities who access the structure affected at greater than a threshold frequency (e.g., a certain number of times per week). Additionally or alternatively, the transmission may be limited to only entities who are within a certain threshold distance from the structure affected (e.g., a certain number of miles within the structure affected). The logic 113 may access emergency systems such as emergency notification systems in order to identify and manage communications with entities without compromising privacy. The responses determined or implemented as described in FIG. 8 are enabled by the synchronization of different information sources and contextual information, as described in FIGS. 2-6.

FIGS. 9-13 illustrate visualizations generated by the logic 113. The visualizations may be populated on an interface, such as, an interface operated by a user on the computing device 120. The visualizations may reflect any of the representation 145, and/or the updated representations 245, 345, 445, 545, or 645, in addition to any of the responses determined in FIGS. 7 and 8, as nodes or elements, such as Document Object Model (DOM) elements. The visualizations may not only depict various views of an incident, but also may permit changes to settings of the visualizations and/or criteria of determining responses. Additionally, the visualizations may protect privacy of entities by redacting sensitive, private, or confidential information. For example, the redaction may be selective and in accordance with a user's access control privileges or levels.

Figure 9:
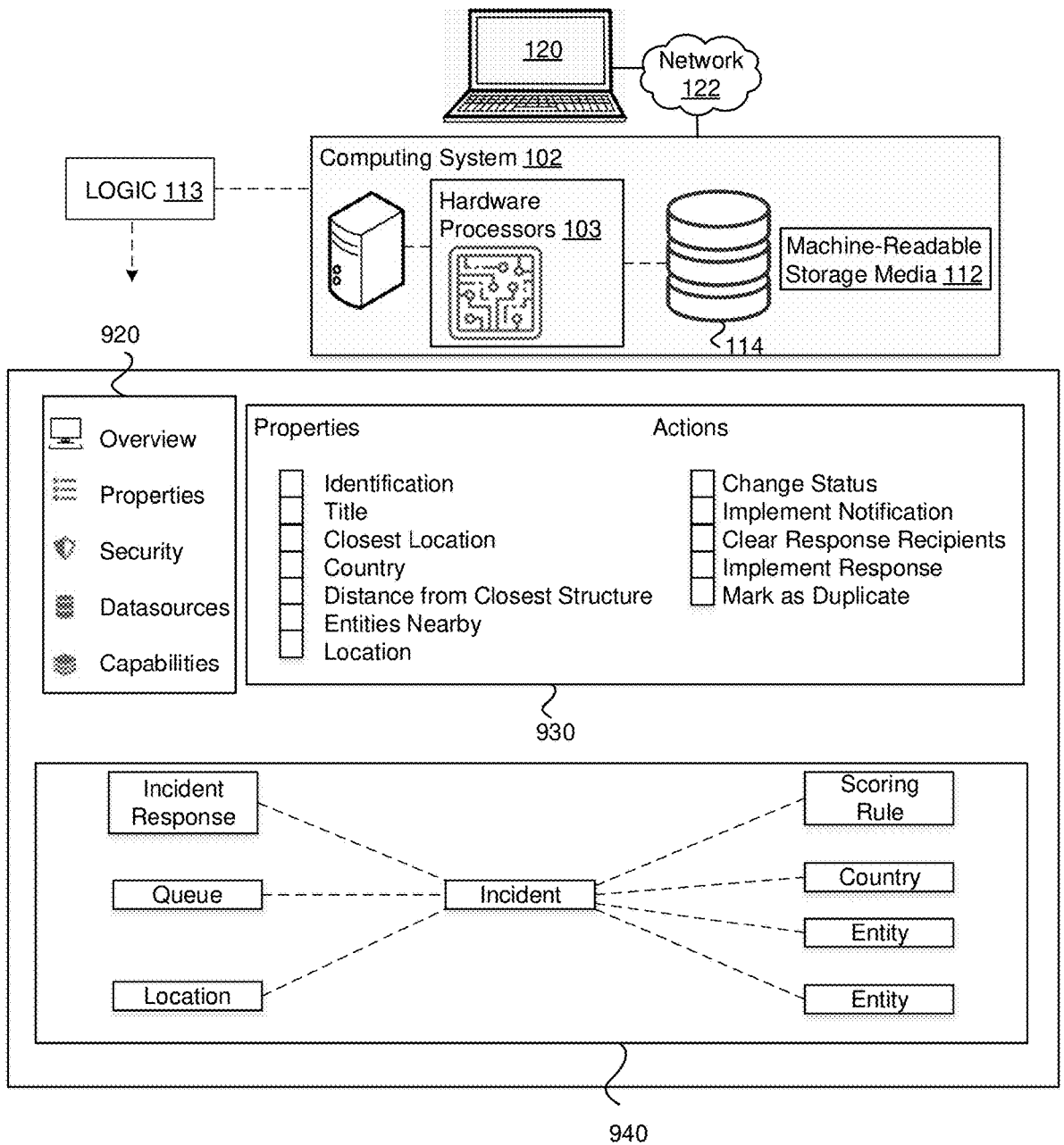
FIG. 9 illustrates, in accordance with various embodiments, an exemplary interface that includes a visualization of an overview of an incident.

In FIG. 9, a tab or pane (hereinafter "tab) 920 includes options that may be selected, including an overview of an incident. The tab 920 includes a properties option, which enables viewing, selection, addition, and/or modification of particular properties or attributes to be illustrated within fields in the window 940. The tab 920 further includes a security option, which enables viewing and/or modification of security settings which may encompass particular attributes or characteristics of entities that are redacted (e.g., name, age, identification numbers and other identification information). The tab 920 further includes a data sources option, which permits viewing of specific parties or sources from which information was obtained, such as the information 141, the additional information 241, 341, the additional sensor data 471, the sensors 573, 574, and 575, and/or the contextual information 641. The data sources option, in some examples, may permit modifications to specific sources from which information is obtained, and/or modifications to a manner (e.g. frequency) in which information is obtained. The tab 920 further includes a capabilities option which permits viewing and/or modifications to computing capabilities, such as machine learning capabilities.

Meanwhile, a window 930 may receive a selection of properties to be rendered in the window 940, and/or actions including changing a status, implementing a notification, clearing response recipients, implementing a response, or marking as duplicate. Changing a status may entail an annotation or indication to modify a resolution status of an incident, such as a change from unresolved to resolved. Implementing a notification may entail transmitting a notification to one or more entities regarding the resolution status, as described, for example, in FIGS. 7 and 8. Clearing response recipients may entail indicating or confirming that a notification has been successfully received by one or more entities. Implementing a response may include transmitting an indication to perform certain actions, as described, for example, in FIGS. 7 and 8. Marking as duplicative may include indicating that two separately listed incidents are actually a common incident, thereby consolidating two previously separate incidents.

The window 940 includes attributes as selected from the properties in the window 930 and depicts relationships between the attributes. Within the window 940, any of the attributes may be clicked on or otherwise selected. Upon selection of any of the attributes, additional information regarding the selected attribute may be populated or displayed. For example, a "scoring rule" may provide additional rationale or information regarding the determination of the score indicative of an exigency of an incident. A "queue" may provide a relative position of the incident within a queue of other incidents to be addressed, thus indicating a relative urgency of the incident.

Figure 10:
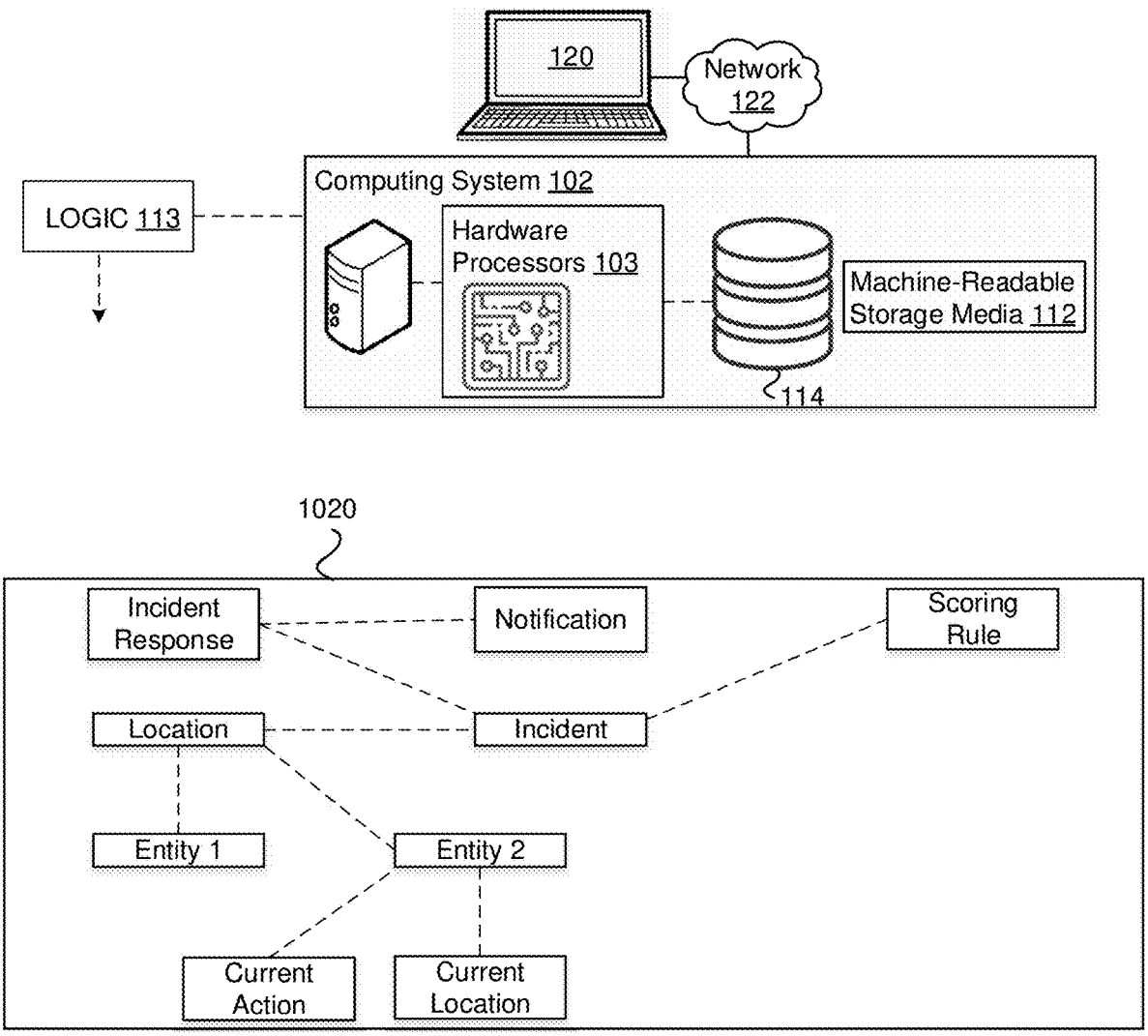
FIG. 10 illustrates, in accordance with various embodiments, an exemplary interface that includes a visualization of an overview of an incident.

FIG. 10 illustrates a window 1020 that integrates information from an incident, such as the information 141, and/or the additional information 241, 341, with additional contextual information (e.g., the additional contextual information 641). The window 1020 may be populated in response to selection of particular properties within the window 930 in FIG. 9. For example, the particular properties selected may include entities affected by an incident. In FIG. 10, attributes linked to an incident include a location of the incident, and one or more entities affected or potentially affected by the incident. For example, the entities may include a building, structure, or asset (e.g., "entity 1") affected by the incident, and a person (e.g., "entity 2") associated with entity 1. For example, the person may be logged within records of entity 1 and/or may have access to entity 1. The attributes include a current location of entity 2 and a current action, which may be determined based on the current location. For example, the current action may be deactivating a card used to access entity 1, that belongs to entity 2. As another example, the current action may be transmitting a notification or a message regarding the incident and/or the incident response. Any of the attributes within the window 1020 may be clicked on or otherwise selected to populate additional information.

Figure 11:
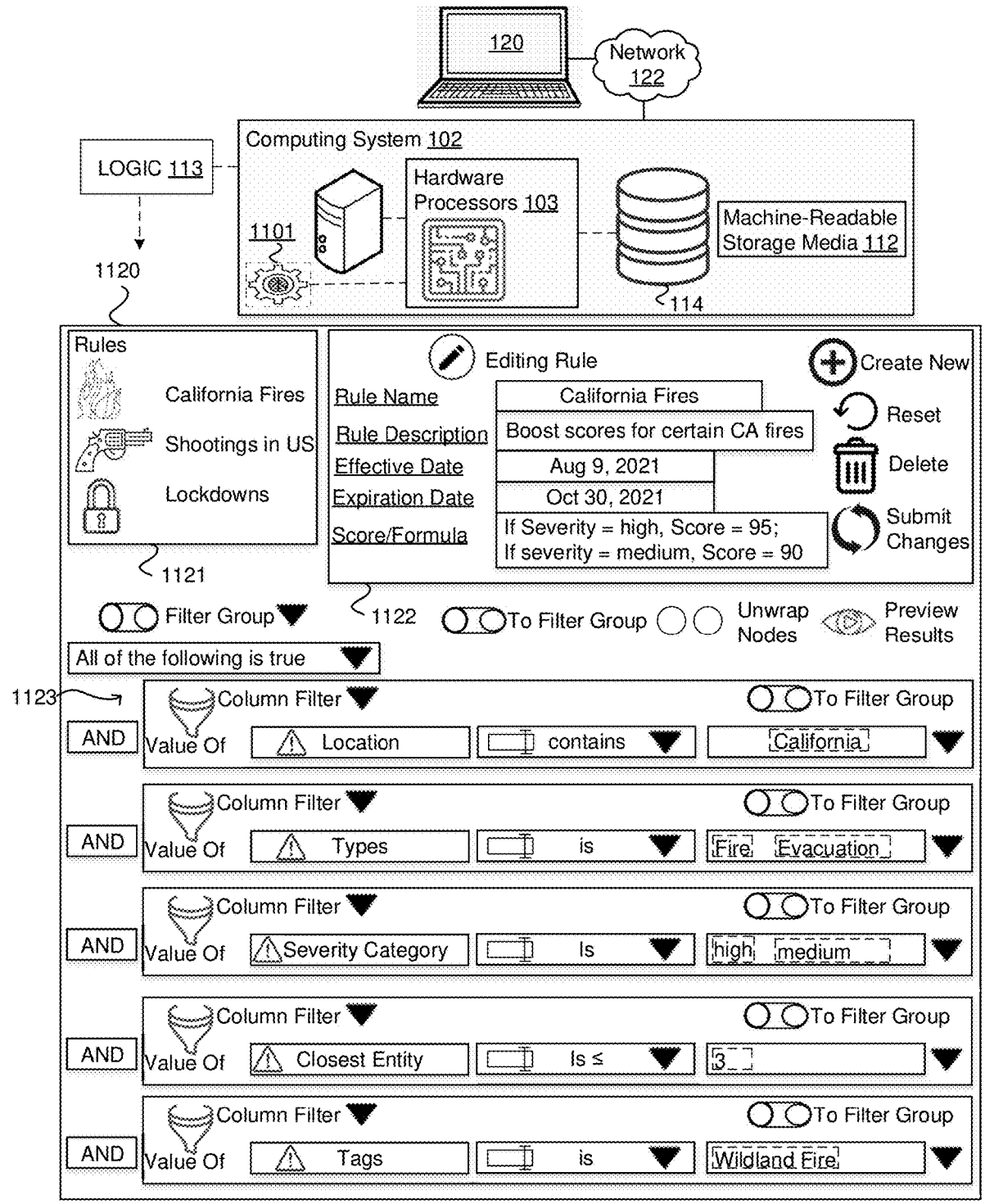
FIG. 11 illustrates, in accordance with various embodiments, an exemplary interface in which rules to determine scores are inputted and modified.

FIG. 11 illustrates an interface 1120 in which rules to determine scores may be set and modified. The scores may be determined based on any of the information 141, the additional information 241, 341, the additional sensor data 471, the sensors 573, 574, and 575, and/or the contextual information 641. The interface 1120 may mask or redact sensitive information according to access controls and governance processes. The scores indicate a relative exigency, priority or urgency level of a response and are used to determine a particular response, as illustrated in FIGS. 7 and 8. The interface 1120 includes a menu 1121 in which a particular type, category, or classification of incident is selected, so that associated scoring rules, parameters, and/or criteria are viewable and modifiable. A window 1122 permits entry or selection of certain scoring rules or criteria for particular types, categories, or classifications of incidents. If a particular type, category, or classification of incident is unavailable within the menu 1121, a new type, category, or classification can be created using the "Create New" icon in the window 1122. A section 1123 of the interface 1120 may further define a particular type, category, or classification of incident for which the scoring rules or criteria, as inputted or modified within the window 1122, apply. For example, the section may include one or more pull down menus or drop down menus that specify, using logical operators, particular conditions or constraints to be satisfied in order for a scoring rule, parameter, or criteria to apply. For example, if any of the conditions within the section 1123 in FIG. 11 are not true, then the scoring rule within the window 1122 would not apply. Specifically, if a severity category, as determined or classified by an external source besides the logic 113 or the computing system 102, is "low," or a distance to a closest entity is greater than 3 (miles), then the scoring rule within the window 1122 would not apply.

The logic 113, and/or a machine learning component or model (hereinafter "machine learning component") 1101 may infer or predict scores as new incidents arise, based on rules previously set, and/or further modifications to scores following the setting of the rules. In some examples, the machine learning component 1101 may be implemented as part of the logic 113. For example, if a new fire in California arises having a severity somewhere between "medium" and "high," the machine learning component 1101 may infer that a score corresponding to the new fire may be 92.5, or somewhere between 90 and 95. The machine learning component 1101 may be improved by iterative feedback. For example, if the machine learning component 1101 infers that a score corresponding to the new fire is 92.5, but feedback indicates that the score corresponding to the new fire is to be 95, then the machine learning component 1101 may infer that any fire in California having a severity somewhere between "medium" and "high" would also have a score of 95, or closer to 95 than 90.

The machine learning component 1101 may be trained using at least two subsets of training data sequentially. A first subset of training data may include examples regarding particular scenarios (e.g., types, classifications, categories, and/or other parameters or attributes regarding incidents) and scores corresponding to, or mapped to, the scenarios. A second subset of training data may be generated, either by the computing system 102 or a separate computing system, and include examples that the machine learning component 1101 incorrectly inferred, or having threshold similarities to the examples that were incorrectly inferred by the machine learning component 1101. In such a manner, the machine learning component 1101 may be improved by retraining on examples in which the machine learning component 1101 performed worst.

Figure 12:
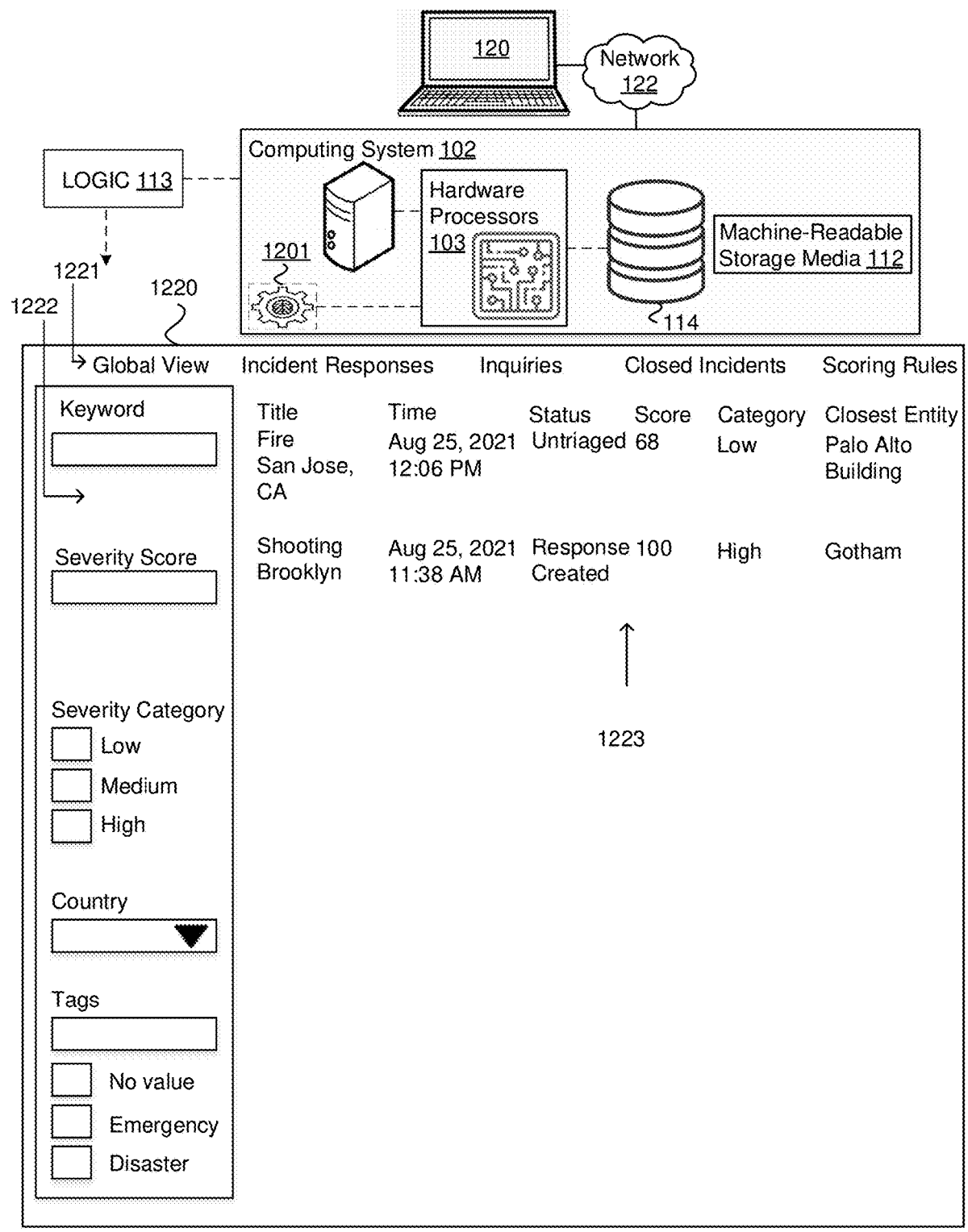
FIG. 12 illustrates, in accordance with various embodiments, contextualized information of incidents based on factors such as severity categories and times.

FIG. 12 illustrates an interface 1220 that illustrates contextualized information of incidents based on factors such as severity categories and times. The interface 1220 may mask or redact sensitive information according to access controls and governance processes. The interface 1220 may include a tabbed menu 1221, which includes tabs that, upon selection, generate one of a global view (as currently selected), incident responses which detail specific responses (e.g., numbers of vehicles and persons deployed), inquiries which may be from one or more persons affected by an incident, closed incidents which have been marked as resolved, and scoring rules which demonstrate how scores of each incident are computed or determined. The interface 1220 may further include a filter menu 1222 that receives criteria to be selected or inputted regarding which incidents are to be shown in a window 1223. For example, if severity category "low" is selected, then only incidents having a severity category of "low" would be displayed within the window 1223.

Within the tabbed menu 1221, upon selection of incident responses, a separate screen, interface, window, menu, or pop-up may be displayed to enable an input, modification, or acceptance (e.g., confirmation) of responses to be implemented for incidents. A machine learning component 1201 may infer or predict responses as new incidents arise, based on previously inputted and/or modified responses. In some examples, the machine learning component 1201 may be implemented as part of the logic 113. For example, if a new fire in California arises having a severity somewhere between "medium" and "high," the machine learning component 1201 may infer a response based on previous inputted, modified, or accepted responses for California fires having severities of "medium" and/or "high." If previous responses indicate that affected persons within 5 miles are to be notified if severity of a California fire is "medium" and affected persons within 10 miles are to be notified if severity of a California fire is "high," then the machine learning component 1201 may infer that a response to a California fire having a severity between "medium" and "high" may be to notify affected persons within distances of between 5 and 10 miles. The machine learning component 1201 may be improved by iterative feedback. For example, if the machine learning component 1201 infers that affected persons within distances of 7.5 miles are to be notified, but feedback indicates that only affected persons within 5 miles are to be notified, then the machine learning component 1201 may infer that any fire in California having a severity somewhere between "medium" and "high" would require notification to affected persons within distances of 5 miles, or closer to 5 miles than 10 miles.

The machine learning component 1201 may be trained using at least two subsets of training data sequentially. A first subset of training data may include examples regarding particular scenarios (e.g., types, classifications, categories, and/or other parameters or attributes regarding incidents) and scores corresponding to, or mapped to, the scenarios. A second subset of training data may be generated, either by the computing system 102 or a separate computing system, and include examples that the machine learning component 1201 incorrectly inferred, or having threshold similarities to the examples that were incorrectly inferred by the machine learning component 1201. In such a manner, the machine learning component 1201 may be improved by retraining on examples in which the machine learning component 1201 performed worst.

Figure 13:
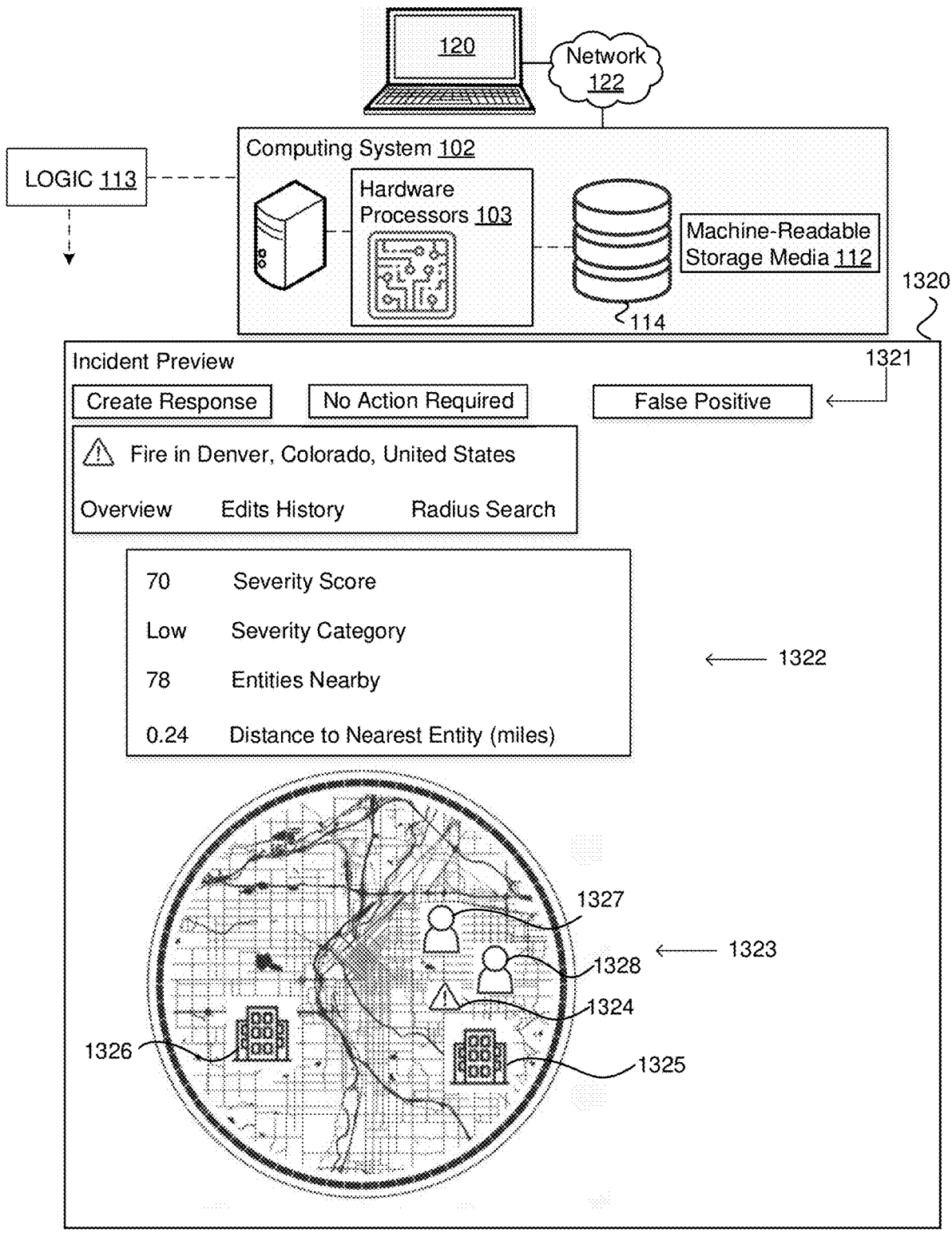
FIG. 13 illustrates, in accordance with various embodiments, an analysis of a particular incident, augmented by additional contextual information.

FIG. 13 illustrates an interface 1320 that presents an analysis of a particular incident, augmented by additional contextual information (e.g., the additional contextual information 641). The interface 1320 includes a menu 1321 in which certain annotations may be applied or certain responses may be created. For example, options or tabs within the menu 1321 may include an option to create or implement a response, an annotation that no action is required, or that no response is to be created or implemented, and/or an annotation that an incident is a false positive, meaning that the perceived incident is not actually an incident. The interface 1320 further includes statistics 1322. The interface 1320 further includes a map view 1323, which includes an indication of a location 1324 of the incident, and surrounding entities affected by or potentially affected by the incident, including structures 1325 and 1326, and persons 1327 and 1328. Upon receiving a selection on any of the surrounding entities, the logic 113 may display a separate window or pop-up that includes information regarding a selected entity, subject to access control, privacy, and/or data governance constraints.

Figure 14:
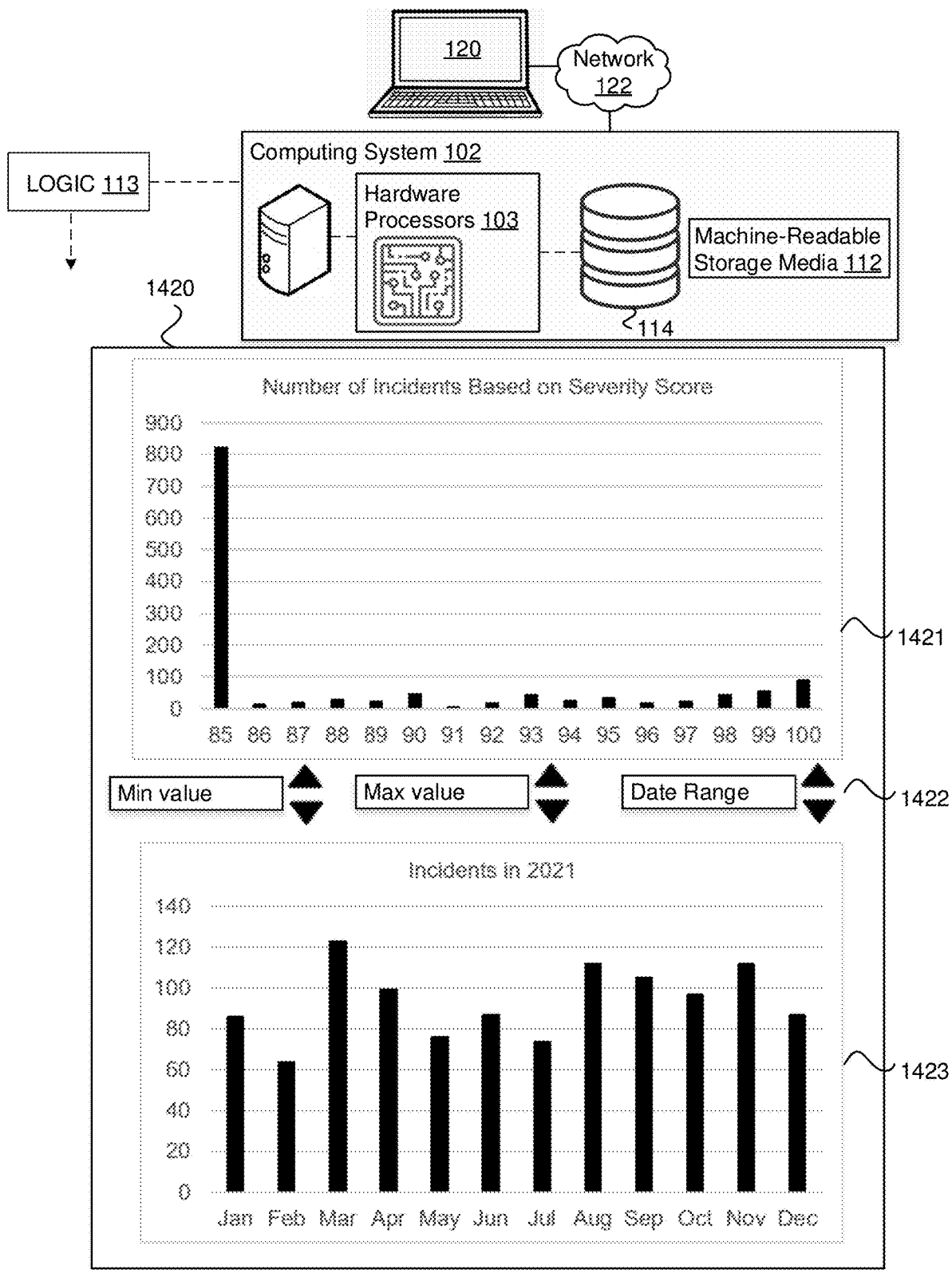
FIG. 14 illustrates, in accordance with various embodiments, an analysis of a number of incidents based on the score and a number of incidents over time.

FIG. 14 illustrates an interface 1420 that includes an analysis of a number of incidents based on the score and a number of incidents over time. For example, the number of incidents based on the score may illustrate how many incidents have been received over a specific time range and over a range of scores. The number of incidents based on the score is depicted by a graph 1421, which illustrates that over 800 incidents were received at a score of 85, and less than 100 incidents were received at other scores from 86 to 100. The graph 1421 may be configurable or adjusted based on values entered within a menu 1422. The values may specify a range of scores and a date range. The interface 1420 further includes a graph 1423, illustrating a breakdown of incidents over a specific time period by specified time ranges (e.g., months).

Figure 15:
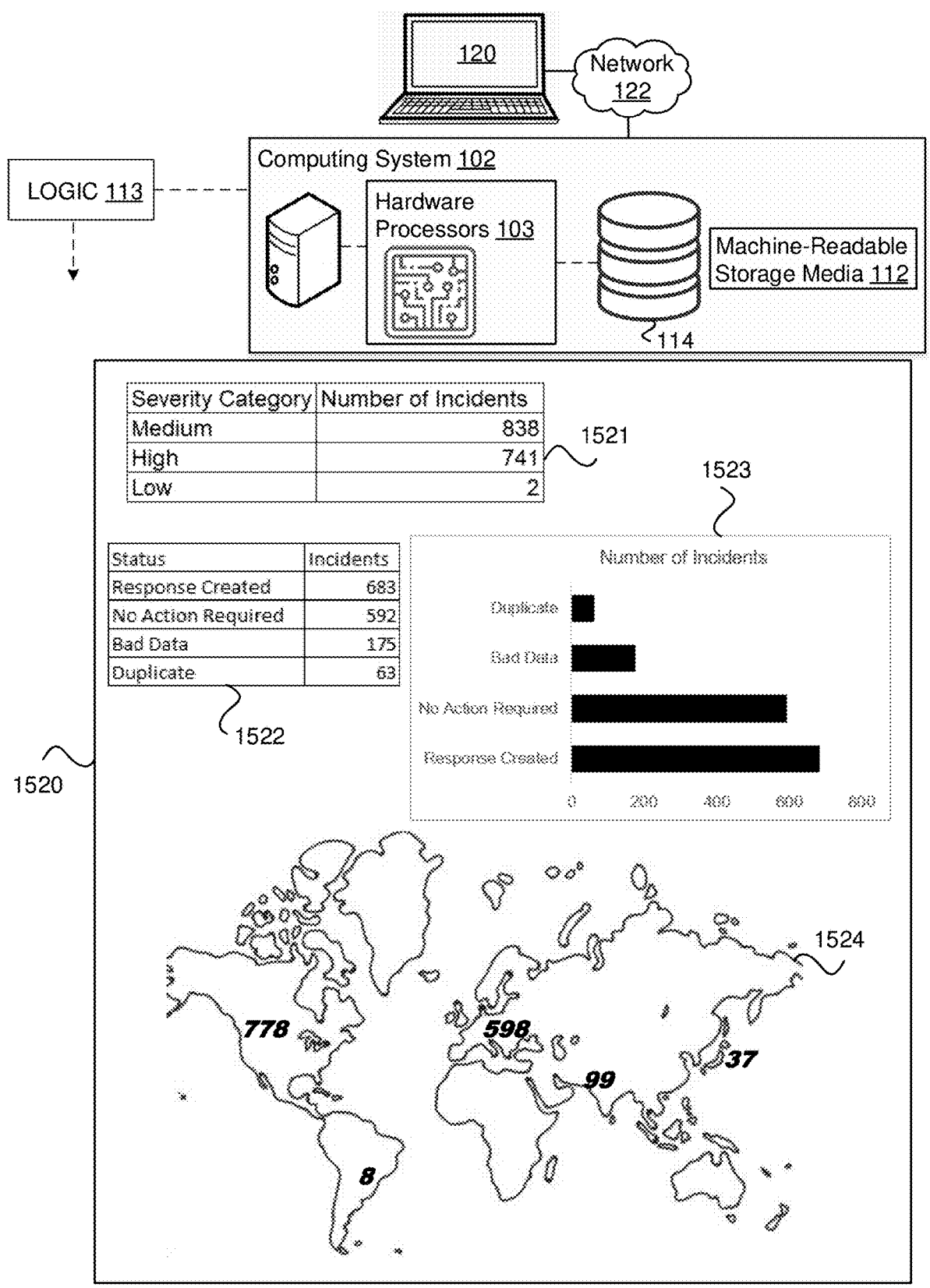
FIG. 15 illustrates, in accordance with various embodiments, a further analysis of incidents and responses

FIG. 15 illustrates an interface 1520 that includes further analysis of incidents and responses. In some examples, the analysis in FIG. 15 may be combined with that in FIG. 14 in a single interface. The interface 1520 includes a table 1521 that illustrates a number of incidents at different severity categories. The interface 1520 further includes a table 1522 that illustrates a number of incidents corresponding to different response statuses or classifications. For example, 683 incidents required implementation of a response. 592 incidents did not require any action. 175 incidents were annotated or indicated as bad data, which includes false positives. 63 incidents were duplicative of other incidents and thus redundant. A chart 1523 illustrates the same information as the table 1522. In some examples, the logic 113 may further analyze each individual group of incidents to determine corresponding scores that were determined for the incidents. For example, of the 592 incidents that did not require any action, the logic 113 may obtain scores associated with each of the aforementioned incidents. If any of those 592 incidents nonetheless had relatively high scores, then the logic 113 may predict or infer one or more rules that should be modified in order to mitigate occurrences of high scores indicative of high exigencies, but do not actually require a response. The interface 1520 may further include a map representation 1524 which illustrates a breakdown of incidents by region.

Figure 16:
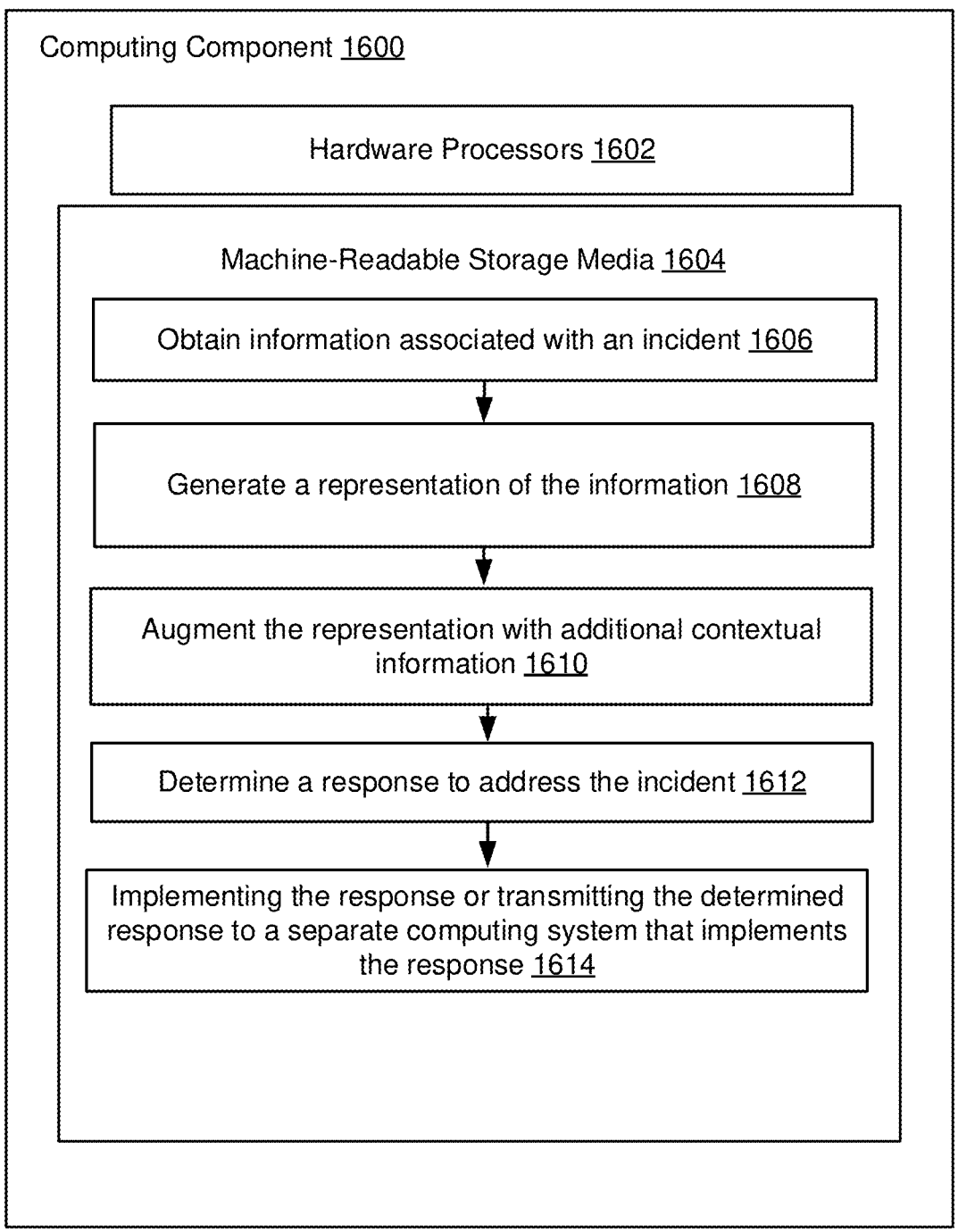
FIG. 16 illustrates a flowchart of an example method consistent with FIGS. 1-15, embodied in a computing component.

FIG. 16 illustrates a computing component 1600 that includes one or more hardware processors 1602 and machine-readable storage media 1604 storing a set of machine-readable/machine-executable instructions that, when executed, cause the hardware processor(s) 1602 to perform an illustrative method of analyzing and responding to an incident, among other steps. It should be appreciated that there can be additional, fewer, or alternative steps performed in similar or alternative orders, or in parallel, within the scope of the various embodiments discussed herein unless otherwise stated. The computing component 1600 may be implemented as the computing system 102 of FIGS. 1-15. The hardware processors 1602 may be implemented as the hardware processors 103 of FIGS. 1-15. The machine-readable storage media 1604 may be implemented as the machine-readable storage media 112 of FIGS. 1-15, and may include suitable machine-readable storage media described in FIG. 17.

At step 1606, the hardware processor(s) 1602 may execute machine-readable/machine-executable instructions stored in the machine-readable storage media 1604 to obtain information (e.g., the information 141 in FIG. 1) associated with an incident. An incident may include any change, unexpected or anomalous event within an environment, such as a catastrophe, disaster, either natural or human-caused, an emergency, a cyber breach, or even minor incidents such as traffic delay, accident, congestion, construction, or closure. The information may be in any format, including, an unstructured format, or a schema such as a database schema, an eXtensible Markup Language (XML) or XML-based schema, or object-oriented schema.

At step 1608, the hardware processor(s) 1602 may execute machine-readable/machine-executable instructions stored in the machine-readable storage media 1604 to generate a representation (e.g., the representation 145, or any of updated representations 245, 345, 445, 545, or 645) of the information. The representation may include an ontology or an ontological representation. The generating of the representation may include transforming a format of the information into an ontological representation. The transformation may include generating a mapping between elements, attributes, or properties from the information into ontological constructs of the ontological representation.

At step 1610, the hardware processor(s) 1602 may execute machine-readable/machine-executable instructions stored in the machine-readable storage media 1604 to augment the representation with additional contextual information (e.g., the contextual information 645). The additional contextual information may include one or more structural entities or infrastructural entities within a threshold distance from the incident and one or more human entities associated with the one or more structural entities. The additional contextual information may facilitate determination of a targeted, focused response directed towards the structural, infrastructural, and/or human entities most likely to be affected by the incident, and/or closest in proximity to the incident.

At step 1612, the hardware processor(s) 1602 may execute machine-readable/machine-executable instructions stored in the machine-readable storage media 1604 to determine a response to address the incident, in response to the augmentation of the representation. The responses are described with respect to FIGS. 7 and 8.

At step 1614, the hardware processor(s) 1602 may execute machine-readable/machine-executable instructions stored in the machine-readable storage media 1604 to implement or deploy the response or transmit the determined response to a separate computing system that implements the response.

Hardware Implementation

The techniques described herein are implemented by one or more special-purpose computing devices. The special-purpose computing devices may be hard-wired to perform the techniques, or may include circuitry or digital electronic devices such as one or more application-specific integrated circuits (ASICs) or field programmable gate arrays (FPGAs) that are persistently programmed to perform the techniques, or may include one or more hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, server computer systems, portable computer systems, handheld devices, networking devices or any other device or combination of devices that incorporate hard-wired and/or program logic to implement the techniques.

Computing device(s) are generally controlled and coordinated by operating system software. Operating systems control and schedule computer processes for execution, perform memory management, provide file system, networking, I/O services, and provide a user interface functionality, such as a graphical user interface ("GUI"), among other things.

Figure 17:
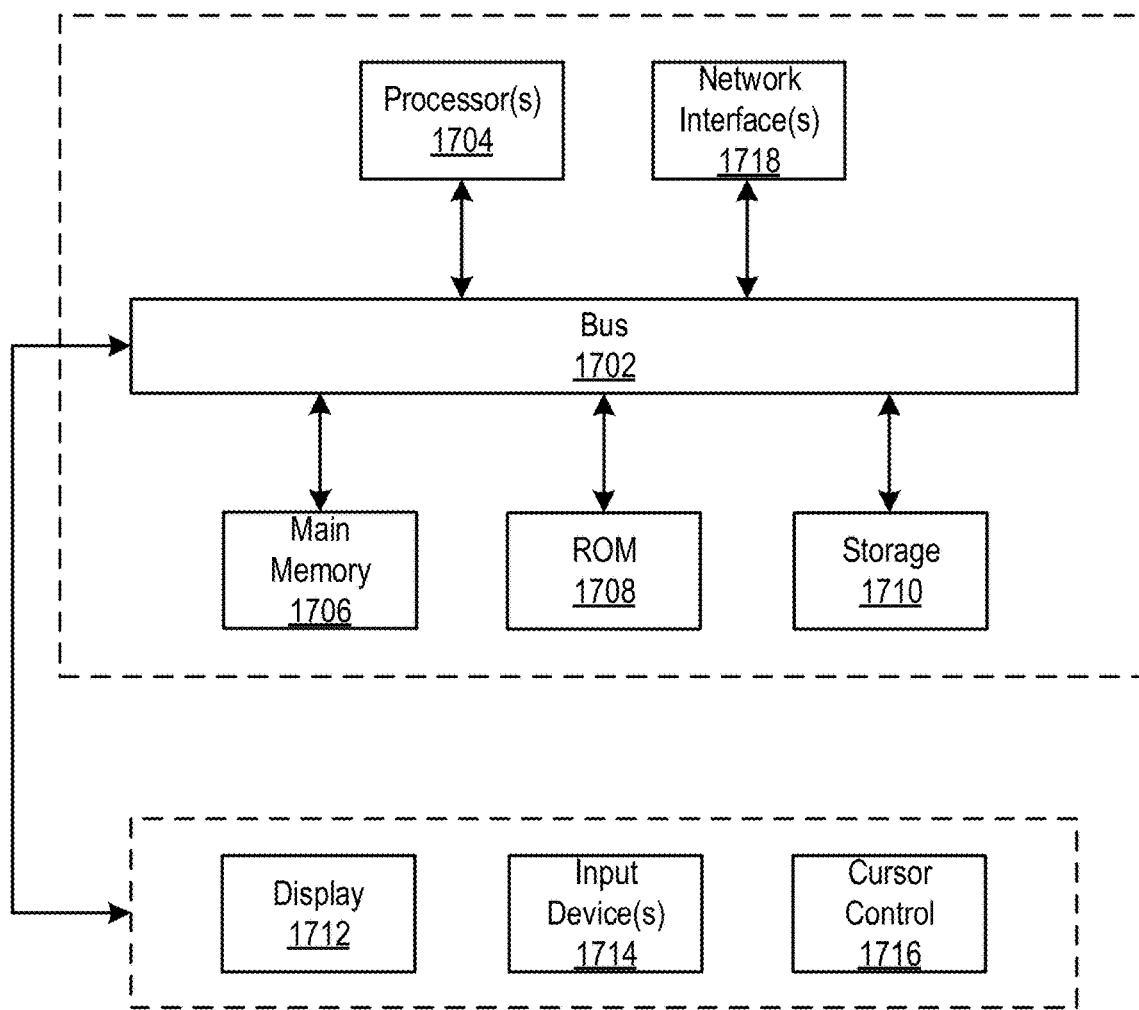
FIG. 17 illustrates a block diagram of an example computer system in which any of the embodiments described herein may be implemented.

FIG. 17 is a block diagram that illustrates a computer system 1700 upon which any of the embodiments described herein may be implemented. In some examples, the computer system 1700 may include a cloud-based or remote computing system. For example, the computer system 1700 may include a cluster of machines orchestrated as a parallel processing infrastructure. The computer system 1700 includes a bus 1702 or other communication mechanism for communicating information, one or more hardware processors 1704 coupled with bus 1702 for processing information. Hardware processor(s) 1704 may be, for example, one or more general purpose microprocessors.

The computer system 1700 also includes a main memory 1706, such as a random access memory (RAM), cache and/or other dynamic storage devices, coupled to bus 1702 for storing information and instructions to be executed by processor 1704. Main memory 1706 also may be used for storing temporary variables or other intermediate information during execution of instructions to be executed by processor 1704. Such instructions, when stored in storage media accessible to processor 1704, render computer system 1700 into a special-purpose machine that is customized to perform the operations specified in the instructions.

The computer system 1700 further includes a read only memory (ROM) 1708 or other static storage device coupled to bus 1702 for storing static information and instructions for processor 1704. A storage device 1710, such as a magnetic disk, optical disk, or USB thumb drive (Flash drive), etc., is provided and coupled to bus 1702 for storing information and instructions.

The computer system 1700 may be coupled via bus 1702 to a display 1712, such as a cathode ray tube (CRT) or LCD display (or touch screen), for displaying information to a computer user. An input device 1714, including alphanumeric and other keys, is coupled to bus 1702 for communicating information and command selections to processor 1704. Another type of user input device is cursor control 1716, such as a mouse, a trackball, or cursor direction keys for communicating direction information and command selections to processor 1704 and for controlling cursor movement on display 1712. This input device typically has two degrees of freedom in two axes, a first axis (e.g., x) and a second axis (e.g., y), that allows the device to specify positions in a plane. In some embodiments, the same direction information and command selections as cursor control may be implemented via receiving touches on a touch screen without a cursor.

The computing system 1700 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "module," as used herein, refers to logic embodied in hardware or firmware, or to a collection of software instructions, possibly having entry and exit points, written in a programming language, such as, for example, Java, C or C++. A software module may be compiled and linked into an executable program, installed in a dynamic link library, or may be written in an interpreted programming language such as, for example, BASIC, Perl, or Python. It will be appreciated that software modules may be callable from other modules or from themselves, and/or may be invoked in response to detected events or interrupts. Software modules configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware modules may be comprised of connected logic units, such as gates and flip-flops, and/or may be comprised of programmable units, such as programmable gate arrays or processors. The modules or computing device functionality described herein are preferably implemented as software modules, but may be represented in hardware or firmware. Generally, the modules described herein refer to logical modules that may be combined with other modules or divided into sub-modules despite their physical organization or storage.

The computer system 1700 may implement the techniques described herein using customized hard-wired logic, one or more ASICs or FPGAs, firmware and/or program logic which in combination with the computer system causes or programs computer system 1700 to be a special-purpose machine. According to one embodiment, the techniques herein are performed by computer system 1700 in response to processor(s) 1704 executing one or more sequences of one or more instructions contained in main memory 1706. Such instructions may be read into main memory 1706 from another storage medium, such as storage device 1710. Execution of the sequences of instructions contained in main memory 1706 causes processor(s) 1704 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 1710. Volatile media includes dynamic memory, such as main memory 1706. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 1702. Transmission media can also take the form of acoustic or light waves, such as those generated during radio-wave and infra-red data communications.

Various forms of media may be involved in carrying one or more sequences of one or more instructions to processor 1704 for execution. For example, the instructions may initially be carried on a magnetic disk or solid state drive of a remote computer. The remote computer can load the instructions into its dynamic memory and send the instructions over a telephone line using a modem. A modem local to computer system 1700 can receive the data on the telephone line and use an infra-red transmitter to convert the data to an infra-red signal. An infra-red detector can receive the data carried in the infra-red signal and appropriate circuitry can place the data on bus 1702. Bus 1702 carries the data to main memory 1706, from which processor 1704 retrieves and executes the instructions. The instructions received by main memory 1706 may retrieves and executes the instructions. The instructions received by main memory 1706 may optionally be stored on storage device 1710 either before or after execution by processor 1704.

The computer system 1700 also includes a communication interface 1718 coupled to bus 1702. Communication interface 1718 provides a two-way data communication coupling to one or more network links that are connected to one or more local networks. For example, communication interface 1718 may be an integrated services digital network (ISDN) card, cable modem, satellite modem, or a modem to provide a data communication connection to a corresponding type of telephone line. As another example, communication interface 1718 may be a local area network (LAN) card to provide a data communication connection to a compatible LAN (or WAN component to communicated with a WAN). Wireless links may also be implemented. In any such implementation, communication interface 1718 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet". Local network and Internet both use electrical, electromagnetic or optical signals that carry digital data streams. The signals through the various networks and the signals on network link and through communication interface 1718, which carry the digital data to and from computer system 1700, are example forms of transmission media.

The computer system 1700 can send messages and receive data, including program code, through the network(s), network link and communication interface 1718. In the Internet example, a server might transmit a requested code for an application program through the Internet, the ISP, the local network and the communication interface 1718.

The received code may be executed by processor 1704 as it is received, and/or stored in storage device 1710, or other non-volatile storage for later execution.

Each of the processes, methods, and algorithms described in the preceding sections may be embodied in, and fully or partially automated by, code modules executed by one or more computer systems or computer processors comprising computer hardware. The processes and algorithms may be implemented partially or wholly in application-specific circuitry.

The various features and processes described above may be used independently of one another, or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Any process descriptions, elements, or blocks in the flow diagrams described herein and/or depicted in the attached figures should be understood as potentially representing modules, segments, or portions of code which include one or more executable instructions for implementing specific logical functions or steps in the process. Alternate implementations are included within the scope of the embodiments described herein in which elements or functions may be removed, executed out of order from that shown or discussed, including substantially concurrently or in reverse order, depending on the functionality involved, as would be understood by those skilled in the art.

It should be emphasized that many variations and modifications may be made to the above-described embodiments, the elements of which are to be understood as being among other acceptable examples. All such modifications and variations are intended to be included herein within the scope of this disclosure. The foregoing description details certain embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the subject matter has been described with reference to specific example embodiments, various modifications and changes may be made to these embodiments without departing from the broader scope of embodiments of the present disclosure. Such embodiments of the subject matter may be referred to herein, individually or collectively, by the term "invention" merely for convenience and without intending to voluntarily limit the scope of this application to any single disclosure or concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

It will be appreciated that "logic," a "system," "data store," and/or "database" may comprise software, hardware, firmware, and/or circuitry. In one example, one or more software programs comprising instructions capable of being executable by a processor may perform one or more of the functions of the data stores, databases, or systems described herein. In another example, circuitry may perform the same or similar functions. Alternative embodiments may comprise more, less, or functionally equivalent systems, data stores, or databases, and still be within the scope of present embodiments. For example, the functionality of the various systems, data stores, and/or databases may be combined or divided differently.

"Open source" software is defined herein to be source code that allows distribution as source code as well as compiled form, with a well-publicized and indexed means of obtaining the source, optionally with a license that allows modifications and derived works.

The data stores described herein may be any suitable structure (e.g., an active database, a relational database, a self-referential database, a table, a matrix, an array, a flat file, a documented-oriented storage system, a non-relational No-SQL system, and the like), and may be cloud-based or otherwise.

As used herein, the term "or" may be construed in either an inclusive or exclusive sense. Moreover, plural instances may be provided for resources, operations, or structures described herein as a single instance. Additionally, boundaries between various resources, operations, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

Although the invention has been described in detail for the purpose of illustration based on what is currently considered to be the most practical and preferred implementations, it is to be understood that such detail is solely for that purpose and that the invention is not limited to the disclosed implementations, but, on the contrary, is intended to cover modifications and equivalent arrangements that are within the spirit and scope of the appended claims. For example, it is to be understood that the present invention contemplates that, to the extent possible, one or more features of any figure or example can be combined with one or more features of any other figure or example. A component being implemented as another component may be construed as the component being operated in a same or similar manner as the another component, and/or comprising same or similar features, characteristics, and parameters as the another component.

The phrases "at least one of," "at least one selected from the group of," or "at least one selected from the group consisting of," and the like are to be interpreted in the disjunctive (e.g., not to be interpreted as at least one of A and at least one of B).

Reference throughout this specification to an "example" or "examples" means that a particular feature, structure or characteristic described in connection with the example is included in at least one example of the present invention. Thus, the appearances of the phrases "in one example" or "in some examples" in various places throughout this specification are not necessarily all referring to the same examples, but may be in some instances. Furthermore, the particular features, structures, or characteristics may be combined in any suitable manner in one or more different examples.

The invention claimed is:

1. A computing system, comprising:
one or more processors; and
memory storing instructions that, when executed by the one or more processors, cause the computing system to perform:
obtaining information associated with an incident, wherein the information comprises unstructured information from different sources, the unstructured information comprising media data:
generating a representation of the information, wherein the generating of the representation comprises;
performing a compression technique on the unstructured information, the compression technique comprising compressing one or more features of the unstructured information having relative information value or relative information content below a threshold value; and
generating a compressed version of the unstructured information by applying the compression technique;
storing the compressed version and the compressed features of the unstructured information within a storage according to a storage criteria, wherein the storage criteria comprises storing portions of the compressed version that have higher information content or higher information value within a first location and portions of the compressed features having lower information content or lower information value within a second location, wherein the first location is configured to retrieve the compressed version of the unstructured information faster compared to the retrieving of the portions of the compressed features from the second location;
retrieving, from the storage, the compressed version;
augmenting the generated representation with additional contextual information;
in response to augmenting the representation, scoring the incident, wherein the scoring of the incident indicates an urgency level of the incident relative to other incidents;

determining a response to address the incident, and implementing the response or transmitting the determined response to a separate computing system that implements the response.

2. The computing system of claim 1, wherein the generating of the representation comprises transforming a format of the information into an ontological representation, the transformation comprising generating a mapping between elements, attributes, or properties from the information into ontological constructs of the ontological representation.

3. The computing system of claim 2, wherein the transformation comprises merging information from the different sources and transforming the merged information into a common ontological representation.

4. The computing system of claim 2, wherein the transformation comprises:
transforming a first format into the ontological representation;
obtaining additional information of a second format; and
modifying the ontological representation to incorporate the additional information.

5. The computing system of claim 2, wherein the transformation comprises:
detecting a change in the format; and
modifying the ontological representation based on the change in the format.

6. The computing system of claim 1, wherein the information comprises a time, a location, a type, and an extent of spread of the incident.

7. The computing system of claim 1, wherein the information comprises textual data and sensor data.

8. The computing system of claim 1, wherein the determining of the response comprises determining a score indicative of an inferred exigency of the incident; and the determining of the response is based on the score.

9. The computing system of claim 1, wherein the additional contextual information comprises one or more structural entities or infrastructural entities within a threshold distance from the incident and one or more human entities associated with the one or more structural entities.

10. The computing system of claim 1, wherein the implementing of the response comprises an electronic or a physical implementation.

11. A computer-implemented method of a computing system, the computer-implemented method comprising:
obtaining information associated with an incident, wherein the information comprises unstructured information from different sources, the unstructured information comprising media data;
generating a representation of the information, wherein the generating of the representation comprises:
performing a compression technique on the unstructured information, the compression technique comprising compressing one or more features of the unstructured information having relative information value or relative information content below a threshold value; and
generating a compressed version of the media data by applying the compression technique;
storing the compressed version and the compressed features of the unstructured information within a storage according to a storage criteria, wherein the storage criteria comprises storing portions of the compressed version that have higher information content or higher information value within a first location and portions of the compressed features having lower information content or lower information value within a second location, wherein the first location is configured to retrieve the compressed version of the unstructured information faster compared to the retrieving of the portions of the compressed features from the second location;
retrieving, from the storage, the compressed version;
augmenting the generated representation with additional contextual information;
in response to augmenting the representation, scoring the incident, wherein the scoring of the incident indicates an urgency level of the incident relative to other incidents;
determining a response to address the incident; and
implementing the response or transmitting the determined response to a separate computing system that implements the response.

12. The computer-implemented method of claim 11, wherein the generating of the representation comprises transforming a format of the information into an ontological representation, the transformation comprising generating a mapping between elements, attributes, or properties from the information into ontological constructs of the ontological representation.

13. The computer-implemented method of claim 12, wherein the transformation comprises merging information from the different sources and transforming the merged information into a common ontological representation.

14. The computer-implemented method of claim 12, wherein the transformation comprises:
transforming a first format into the ontological representation;
obtaining additional information of a second format; and
modifying the ontological representation to incorporate the additional information.

15. The computer-implemented method of claim 12, wherein the transformation comprises:
detecting a change in the format; and
modifying the ontological representation based on the change in the format.

16. The computer-implemented method of claim 11, wherein the information comprises a time, a location, a type, and an extent of spread of the incident.

17. The computer-implemented method of claim 11, wherein the implementing of the response comprises an electronic or a physical implementation.

18. The computing system of claim 1, wherein the implementing of the response comprises deactivating a scanner or a reader that is associated with a physical structure affected by the incident.

19. The computing system of claim 1, wherein the scoring of the incident is based on a machine learning component, wherein the machine learning component is sequentially trained based on a first training dataset that includes first scenarios and a second training dataset that includes second scenarios, wherein the second scenarios comprise incorrectly inferred scores.

20. The computing system of claim 1, wherein the storage criteria comprises a tiered storage criteria, the first location comprises a higher tier, and the second location comprises a lower tier.

* * * * *